(12) United States Patent
Niisoe et al.

(10) Patent No.: US 7,964,451 B2
(45) Date of Patent: Jun. 21, 2011

(54) SOLID STATE IMAGING DEVICE AND METHOD FOR FABRICATING THE SAME

(75) Inventors: Naoto Niisoe, Toyama (JP); Kazuhisa Hirata, Kyoto (JP); Tohru Yamada, Tokyo (JP)

(73) Assignee: Panasonic Corporation, Osaka (JP)

( * ) Notice: Subject to any disclaimer, the term of this patent is extended or adjusted under 35 U.S.C. 154(b) by 142 days.

(21) Appl. No.: 12/162,697

(22) PCT Filed: Dec. 6, 2006

(86) PCT No.: PCT/JP2006/324790
§ 371 (c)(1),
(2), (4) Date: Jul. 30, 2008

(87) PCT Pub. No.: WO2007/086204
PCT Pub. Date: Aug. 2, 2007

(65) Prior Publication Data
US 2009/0194795 A1   Aug. 6, 2009

(30) Foreign Application Priority Data

Jan. 30, 2006   (JP) ................................ 2006-020299

(51) Int. Cl.
  *H01L 21/339* (2006.01)
  *H01L 27/148* (2006.01)
  *H01L 21/00* (2006.01)
  *H01L 31/062* (2006.01)

(52) U.S. Cl. ............ 438/144; 438/60; 438/73; 438/75; 438/78; 257/222; 257/291; 257/448; 257/E21.617; 257/E27.15; 257/E27.153; 257/E27.154; 257/E31.083; 257/E31.084

(58) Field of Classification Search .................. 257/222, 257/448, E31.124, E21.54, 60, 291, E31.083–E31.084, 257/E27.15, E21.617, E27.153–E27.154; 438/73, 75, 78, 144
See application file for complete search history.

(56) References Cited

U.S. PATENT DOCUMENTS 4,677,737 A   7/1987   Corrie et al.
5,189,499 A * 2/1993   Izumi et al. .................. 257/215
(Continued)

FOREIGN PATENT DOCUMENTS

JP   2-189937   7/1990
(Continued)

*Primary Examiner* — Zandra Smith
*Assistant Examiner* — Jeremy J Joy
(74) *Attorney, Agent, or Firm* — McDermott Will & Emery LLP

(57) ABSTRACT

A first oxide film (102) is formed on a semiconductor substrate (101). A first nitride film (103) is formed on first gate electrode formation regions of the first oxide film (102). A plurality of first gate electrodes (104) are provided on the first nitride film (103) so as to be spaced apart from one another with a predetermined distance therebetween. A second oxide film (105) covers upper part and side walls of each of the first gate electrodes (104). A sidewall spacer (106) of a third oxide film is buried in an overhang portion generated on each side wall of each of the first gate electrodes (104) covered by the second oxide film (105). A second nitride film (107) covers the second oxide film (105), the sidewall spacer (106) and part of the first oxide film (102) located between the first gate electrodes (104). A plurality of second gate electrodes (108) are formed on at least part of the second nitride film (107) located between adjacent two of the first gate electrodes (104).

6 Claims, 17 Drawing Sheets

U.S. PATENT DOCUMENTS

| | | | |
|---|---|---|---|
| 5,238,863 A | 8/1993 | Fukusho et al. | |
| 5,334,867 A * | 8/1994 | Shin et al. | 257/222 |
| 5,434,097 A * | 7/1995 | Shin et al. | 438/60 |
| 5,858,811 A | 1/1999 | Tohyama | |
| 5,895,944 A * | 4/1999 | Yamada | 257/233 |
| 6,090,640 A * | 7/2000 | Ogawa | 438/78 |
| 6,251,719 B1 * | 6/2001 | Wang | 438/238 |
| 6,319,839 B1 * | 11/2001 | Chien et al. | 438/704 |
| 6,448,592 B1 * | 9/2002 | Peek et al. | 257/215 |
| 2003/0146471 A1 | 8/2003 | Tanaka et al. | |
| 2004/0203182 A1 * | 10/2004 | Tanaka et al. | 438/73 |
| 2005/0036052 A1 | 2/2005 | Kokubun et al. | |
| 2005/0274996 A1 * | 12/2005 | Iwawaki | 257/292 |

FOREIGN PATENT DOCUMENTS

| | | |
|---|---|---|
| JP | 2-292834 | 12/1990 |
| JP | 4-335572 | 11/1992 |
| JP | 5-182992 | 7/1993 |
| JP | 5-267355 | 10/1993 |
| JP | 6-85234 | 3/1994 |
| JP | 2003-229440 | 8/2003 |

* cited by examiner

No etching residue (a)

(b)

(c)

(d)

(e)

(f)

No etching residue

No etching residue (a)

(b)

(c)

(d)

(e)

(a)

(b)

No etching residue (a)

(b)

(c)

(d)

(e)

(a)

Thickness of part of oxide film located on lower part of electrode is small (b)

Thickness of nitride film differs under gate → Potential difference occurs (a)

(b)

(c)

(d)

(e)

(f)

(g)

US 7,964,451 B2

SOLID STATE IMAGING DEVICE AND METHOD FOR FABRICATING THE SAME

RELATED APPLICATIONS

This application is the U.S. National Phase under 35 U.S.C. § 371 of International Application No. PCT/JP2006/324790, filed on Dec. 6, 2006, which in turn claims the benefit of Japanese Application No. 2006-020299, filed on Jan. 30, 2006, the disclosures of which Applications are incorporated by reference herein.

TECHNICAL FIELD

The present invention relates to a solid state imaging device and a method for fabricating the solid state imaging device, and more particularly relates to a high-performance, high-breakdown voltage solid state imaging device.

BACKGROUND ART

In general, a solid state imaging device includes a plurality of pixel portions each including a plurality of pixels arranged in a matrix. Each pixel includes a photoreceptor portion configured to output an electric signal according to an amount of incident light and a transfer portion configured to sequentially transfer stored charges. The photoreceptor and the transfer portion are provided on a principal surface of a semiconductor substrate.

A structure of a transfer portion of a typical known solid state imaging device and a method for forming the transfer portion will be described with reference to FIGS. 15(a) through 15(e).

First, as shown in FIG. 15(a), a silicon oxide film 12 and a silicon nitride film 13 are formed over a semiconductor substrate 11 so as to be stacked in this order and then a polysilicon layer 14A is formed over the semiconductor substrate 11.

Next, as shown in FIG. 15(b), the polysilicon layer 14A is patterned using lithography and etching, thereby forming a first gate electrode 14. In this patterning, a certain amount of reduction in film thickness occurs due to etching in part of the silicon nitride film 13 other than part thereof located under the first gate electrode 14.

Next, as shown in FIG. 15(c), polysilicon forming the first gate electrode 14 is thermally oxidized, thereby forming a silicon oxide film 15 on upper part and side walls of the first gate electrode 14. Because of a difference between an oxide film growth rate on the silicon nitride film 13 and an oxide film growth rate on the polysilicon film forming the first gate electrode 14, a surface of the silicon nitride film 13 is hardly oxidized.

Next, as shown in FIG. 15(d), a polysilicon layer 16A is formed over the semiconductor substrate 11.

Next, as shown in FIG. 15(e), the polysilicon layer 16A is patterned using lithography and etching, thereby forming a second gate electrode 16 partially overlapping with the first gate electrode 14.

The above-described known solid state imaging device has the following problems. FIGS. 16(a) and 16(b) are cross-sectional views for explaining the problems of the structure of the transfer portion of the known solid state imaging device.

First, the second gate electrode 16 is electrically separated from the first gate electrode by the silicon oxide film 15 and overlaps with the first gate electrode 14. As described above, the silicon oxide film 15 is formed utilizing a difference in oxide film growth rate between the silicon nitride film 13 and the polysilicon film forming the first gate electrode 14. Thus, as shown in FIG. 16(a), a thickness of the silicon oxide film 15 interposed between the first gate electrode 14 and the second gate electrode 16 is smaller in part thereof located on lower parts of the side walls of the first gate electrode 14 than in other part thereof. Accordingly, an inter-gate leakage current is easily generated in the part of the silicon oxide film 15 located on the lower parts of the side walls of the first gate electrode 14.

Second, due to etching performed in forming the first gate electrode 14, a film thickness is reduced by a certain amount in part of the silicon nitride film 13 other than the part thereof located under the first gate electrode 14. Accordingly, the part of the silicon nitride film 13 located under the first gate electrode 14 and part of the silicon nitride film 13 located under the second gate electrode 16 have different thicknesses. As a result, a dielectric capacitance between the first gate electrode 14 and the semiconductor substrate 11 and a dielectric capacitance between the second gate electrode 16 and the semiconductor substrate 11 differ from each other. Therefore, as shown in FIG. 16(b), a potential under each gate electrode varies, and degradation of characteristics such as reduction in a saturated charge amount for charges to be stored and reduction in transfer efficiency are caused. In FIG. 16(b), VL and VM denote voltage levels applied to the gate electrodes, respectively.

To cope with the above-described problems, as described in Patent Reference 1, a technique characterized in that after removal of a silicon nitride film, a silicon nitride film is newly formed has been proposed.

Hereafter, a solid state imaging device described in Patent Reference 1 and a method for fabricating the solid state imaging device will be described with reference to FIGS. 17(a) through 17(g).

First, as shown in FIG. 17(a), a silicon oxide film 22 and a silicon nitride film 23 are formed over a semiconductor substrate 21 so as to be stacked in this order and then a polysilicon layer 24A is formed over the semiconductor substrate 21.

Next, as shown in FIG. 17(b), the polysilicon layer 24A is patterned using lithography and etching, thereby forming a first gate electrode 24. In this patterning, a certain amount of reduction in film thickness occurs due to etching in part of the silicon nitride film 23 other than part thereof located under the first gate electrode 24.

Next, as shown in FIG. 17(c), polysilicon forming the first gate electrode 24 is thermally oxidized, thereby forming a silicon oxide film 25 on upper part and side walls of the first gate electrode 24. Because of a difference between an oxide film growth rate on the silicon nitride film 23 and an oxide film growth rate on the polysilicon film forming the first gate electrode 24, a surface of the silicon nitride film 23 is hardly oxidized.

Next, as shown in FIG. 17(d), the part of the silicon nitride film 23 other than the part thereof located under the first gate electrode 24 is removed by wet etching using phosphoric acid which is highly selective with respect to the silicon oxide film 25.

Next, as shown in FIG. 17(e), a silicon nitride film 26 is formed over the semiconductor substrate 21 so as to have the same thickness as a thickness of the part of the silicon nitride film 23 located under the first gate electrode 24.

Next, as shown in FIG. 17(f), a polysilicon layer 27A is formed over the semiconductor substrate 21.

Next, as shown in FIG. 17(g), the polysilicon layer 27A is patterned using lithography and etching, thereby forming a second gate electrode 27 partially overlapping with the first gate electrode 24.

In the above-described solid state imaging device of Patent Reference 1, an interlevel film for electrically separating the first gate electrode 24 and the second gate electrode 27 from each other is formed of the silicon oxide film 25 and the silicon nitride film 26. Thus, an inter-gate leakage current is hardly generated, so that a breakdown voltage between gate electrodes is improved. Moreover, part of the silicon nitride film 23 located under the first gate electrode 24 has the same thickness as a thickness of part of the second nitride film 26 located under the second gate electrode 27. Therefore, a potential difference under the gate electrodes can be prevented, so that excellent transfer efficiency can be achieved.

[Patent Reference 1]
Japanese Laid-Open Publication No. 6-85234
[Patent Reference 2]
Japanese Laid-Open Publication No. 4-335572
[Patent Reference 3]
Japanese Laid-Open Publication No. 5-267355
[Patent Reference 4]
Japanese Laid-Open Publication No. 2003-229440

DISCLOSURE OF THE INVENTION

Problems that the Invention is to Solve

However, the solid state imaging device of Patent Reference 1 has the following problems. FIGS. 18(a) through 18(d) are cross-sectional views for explaining the problems of a structure of a transfer portion of the solid state imaging device of Patent Reference 1.

In fabrication of the solid state imaging device described in Patent Reference 1, formation of a silicon oxide film 25 is formed by thermal oxidation of polysilicon utilizing a difference between an oxide film growth rate on the silicon nitride film 23 and an oxide film growth rate on the polysilicon film forming the first gate electrode 24. Thus, a thickness of the silicon oxide film 25 interposed between the first gate electrode 24 and the second gate electrode 27 is smaller in parts thereof located on lower parts of the side walls of the first gate electrode 24 than in other parts thereof and, as a result, as shown in FIG. 18(a), an overhang shape is generated. Therefore, when etching of polysilicon is performed for forming the second gate electrode 27, an etching residue of the polysilicon layer 27A might remain in an overhang portion even in a region (see FIG. 18(d)) from which the polysilicon layer has to be completely removed. As shown in FIG. 18(b), when a silicon oxide film 28 is formed by thermally oxidizing polysilicon forming the second gate electrode 27, an etching residue of polysilicon is normally oxidized. However, with an etching residue buried in the overhang portion, since the silicon nitride film 26 remains in part surrounding the overhang portion, hydrogen and oxygen are less easily supplied to the etching residue during oxidation and, as shown in FIG. 18(c), the etching residue is not oxidized and is left to remain. As a result, as shown in FIG. 18(d) which is a plan view illustrating a shape of the gate electrode, gate electrodes having different phases are electrically connected to one another via the etching residue of the polysilicon layer 27A.

In the view of the above-described problems, it is therefore an object of the present invention to provide a high-performance, high-breakdown voltage solid state imaging device and a method for fabricating the solid state imaging device.

Solution to the Problems

To achieve the above-described object, the present inventors conducted various examinations and, as a result of the examinations, reached the finding that after formation of a silicon oxide film on upper part and side walls of a first gate electrode, an overhang shape generated due to a difference between an oxide film growth rate on a nitride film lying under the first gate electrode and an oxide film growth rate on a polysilicon film is modified by forming sidewall spacers of a CVD (chemical vapor deposition) insulating film so as to be buried in an overhang portion generated on side walls of the first gate electrode covered by the silicon oxide film, so that the generation of an etching residue of polysilicon when a second gate electrode is formed can be prevented. That is, the present inventors found that the above-described problem of the solid state imaging device descried in Patent Reference 1 can be overcome.

Specifically, a first solid state imaging device according to the present invention includes: a semiconductor substrate; a first oxide film formed on the semiconductor substrate; a first nitride film formed on first gate electrode formation regions of the first oxide film; a plurality of first gate electrodes formed on the first nitride film so as to be spaced apart from one another with a predetermined distance therebetween; a second oxide film formed so as to cover upper part and side walls of each of the first gate electrodes; a sidewall spacer formed of a third oxide film so as to be buried in an overhang portion generated on each side wall of each of the first gate electrodes covered by the second oxide film; a second nitride film formed so as to cover the second oxide film, the sidewall spacer and part of the first oxide film located between the first gate electrodes; and a plurality of second gate electrodes formed on at least part of the second nitride film located between adjacent two of the first gate electrodes. In the first solid state imaging device, each of the second gate electrodes is separated from an associated one of the first gate electrodes by the second oxide film, the sidewall spacer and the second nitride film and separated from the semiconductor substrate by the first oxide film and the second nitride film.

A second solid state imaging device according to the present invention includes: a semiconductor substrate; a first oxide film and a first nitride film formed over the semiconductor substrate so as to be stacked in this order; a plurality of first gate electrodes formed on the first nitride film so as to be spaced apart from one another with a predetermined distance therebetween; a second oxide film formed so as to cover upper part and side walls of each of the first gate electrodes; a sidewall spacer formed of a third oxide film so as to be buried in an overhang portion generated on each side wall of each of the first gate electrodes covered by the second oxide film; a second nitride film formed so as to cover the second oxide film, the sidewall spacer and part of the first nitride film located between the first gate electrodes; and a plurality of second gate electrodes formed on at least part of the second nitride film located between adjacent two of the first gate electrodes. In the second solid state imaging device, each of the second gate electrodes is separated from an associated one of the first gate electrodes by the second oxide film, the sidewall spacer and the second nitride film and separated from the semiconductor substrate by the first oxide film, the first nitride film and the second nitride film.

A third solid state imaging device according to the present invention includes: a semiconductor substrate; a first oxide film formed on the semiconductor substrate; a first nitride film formed on first gate electrode formation regions of the first oxide film; a plurality of first gate electrodes formed on the first nitride film so as to be spaced apart from one another with a predetermined distance therebetween; a second oxide film formed so as to cover upper part and side walls of each of the first gate electrodes; a second nitride film formed so as to cover the second oxide film and part of the first oxide film located between the first gate electrodes; a sidewall spacer formed of a third oxide film so as to be buried in an overhang portion generated on each side wall of each of the first gate electrodes covered by the second oxide film and the second nitride film; and a plurality of second gate electrodes formed on at least part of the second nitride film located between adjacent two of the first gate electrodes. In the third solid state imaging device, each of the second gate electrodes is separated from an associated one of the first gate electrodes by the second oxide film, the second nitride film and the sidewall spacer and separated from the semiconductor substrate by the first oxide film and the second nitride film.

A fourth solid state imaging device according to the present invention includes: a semiconductor substrate; a first oxide film and a first nitride film formed over the semiconductor substrate so as to be stacked in this order; a plurality of first gate electrodes formed on the first nitride film so as to be spaced apart from one another with a predetermined distance therebetween; a second oxide film formed so as to cover upper part and side walls of each of the first gate electrodes; a second nitride film formed so as to cover the second oxide film and part of the first nitride film located between the first gate electrodes; a sidewall spacer formed of a third oxide film so as to be buried in an overhang portion generated on each side wall of each of the first gate electrodes covered by the second oxide film and the second nitride film; and a plurality of second gate electrodes formed on at least part of the second nitride film located between adjacent two of the first gate electrodes. In the fourth solid state imaging device, each of the second gate electrodes is separated from an associated one of the first gate electrodes by the second oxide film, the second nitride film and the sidewall spacer and separated from the semiconductor substrate by the first oxide film, the first nitride film and the second nitride film.

A first method for fabricating a solid state imaging device according to the present invention includes: a first step of forming a first oxide film and a first nitride film over a semiconductor substrate so that the first oxide film and the first nitride film are stacked in this order; a second step of forming, on the first nitride film, a plurality of first gate electrodes so that the first gate electrodes are arranged so as to be spaced apart from one another with a predetermined distance therebetween; a third step of forming a second oxide film so that the second oxide film covers upper part and side walls of each of the first gate electrodes; a fourth step of forming a sidewall spacer of a third oxide film so that the sidewall spacer is buried in an overhang portion generated on each side wall of each of the first gate electrodes covered by the second oxide film; a fifth step of forming, after removal of part of the first nitride film located between the first gate electrodes, a second nitride film so that the second nitride film covers the second oxide film, the sidewall spacer and part of the first oxide film located between the first gate electrodes; and a sixth step of forming a plurality of second gate electrodes on at least part of the second nitride film located between adjacent two of the first gate electrodes.

A second method for fabricating a solid state imaging device according to the present invention includes: a first step of forming a first oxide film and a first nitride film over a semiconductor substrate so that the first oxide film and the first nitride film are stacked in this order; a second step of forming, on the first nitride film, a plurality of first gate electrodes so that the first gate electrodes are arranged so as to be spaced apart from one another with a predetermined distance therebetween; a third step of forming a second nitride film so that the second nitride film covers upper part and side walls of each of the first gate electrodes; a fourth step of forming a sidewall spacer of a third oxide film so that the sidewall spacer is buried in an overhang portion generated on each side wall of each of the first gate electrodes covered by the second oxide film; a fifth step of forming a second nitride film so that the second nitride film covers the second oxide film, the sidewall spacer and part of the first nitride film located between the first gate electrodes; and a sixth step of forming a plurality of second gate electrodes on at least part of the second nitride film located between adjacent two of the first gate electrodes.

A third method for fabricating a solid state imaging device according to the present invention includes: a first step of forming a first oxide film and a first nitride film over a semiconductor substrate so that the first oxide film and the first nitride film are stacked in this order; a second step of forming, on the first nitride film, a plurality of first gate electrodes so that the first gate electrodes are arranged so as to be spaced apart from one another with a predetermined distance therebetween; a third step of forming a second oxide film so that the second oxide film covers upper part and side walls of each of the first gate electrodes; a fourth step of forming, after removal of part of the first nitride film located between the first gate electrodes, a second nitride film so that the second nitride film covers the second oxide film and part of the first oxide film located between the first gate electrodes; a fifth step of forming a sidewall spacer of a third oxide film so that the sidewall spacer is buried in an overhang portion generated on each side wall of each of the first gate electrodes covered by the second oxide film and the second nitride film; and a sixth step of forming a plurality of second gate electrodes on at least part of the second nitride film located between adjacent two of the first gate electrodes.

A fourth method for fabricating a solid state imaging device according to the present invention includes: a first step of forming a first oxide film and a first nitride film over a semiconductor substrate so that the first oxide film and the first nitride film are stacked in this order; a second step of forming, on the first nitride film, a plurality of first gate electrodes so that the first gate electrodes are arranged so as to be spaced apart from one another with a predetermined distance therebetween; a third step of forming a second oxide film so that the second oxide film covers upper part and side walls of each of the first gate electrodes; a fourth step of forming a second nitride film so that the second nitride film covers the second oxide film and part of the first nitride film located between the first gate electrodes; a fifth step of forming a sidewall spacer of a third oxide film so that the sidewall spacer is buried in an overhang portion generated on each side wall of each of the first gate electrodes covered by the second oxide film and the second nitride film; and a sixth step of forming a plurality of second gate electrodes on at least part of the second nitride film located between adjacent two of the first gate electrodes.

EFFECTS OF THE INVENTION

As has been described, according to the present invention, by forming a sidewall spacer of a third oxide film in an overhang portion generated on each side wall of each of first electrodes covered by a second oxide film, an overhang shape generated due to a difference between an oxide film growth rate on, for example, a polysilicon forming each of the first electrodes and an oxide film growth rate on a first nitride film can be modified. Thus, the generation of an etching residue in etching, for example, a polysilicon film forming each of second gate electrodes can be prevented. Accordingly, electrical connection between gate electrodes having different phases can be avoided, so that a high-breakdown voltage solid state imaging device can be obtained.

According to the present invention, a thickness of a nitride film located under each of first gate electrodes and a thickness of a nitride film located under each of second gate electrodes can be set to be the same. Thus, the generation of a difference between potentials under the gate electrodes can be prevented, so that excellent saturated charge amount and transfer efficiency can be maintained.

According to the present invention, each of the first gate electrodes and an associated one of the second gate electrodes are electrically separated from each other by a second oxide film, a sidewall spacer of a third oxide film and a second nitride film. Thus, an inter-gate breakdown voltage is improved, so that a leakage current is much less likely to be generated.

EXPLANATION OF REFERENCE NUMERALS

Figure 1:
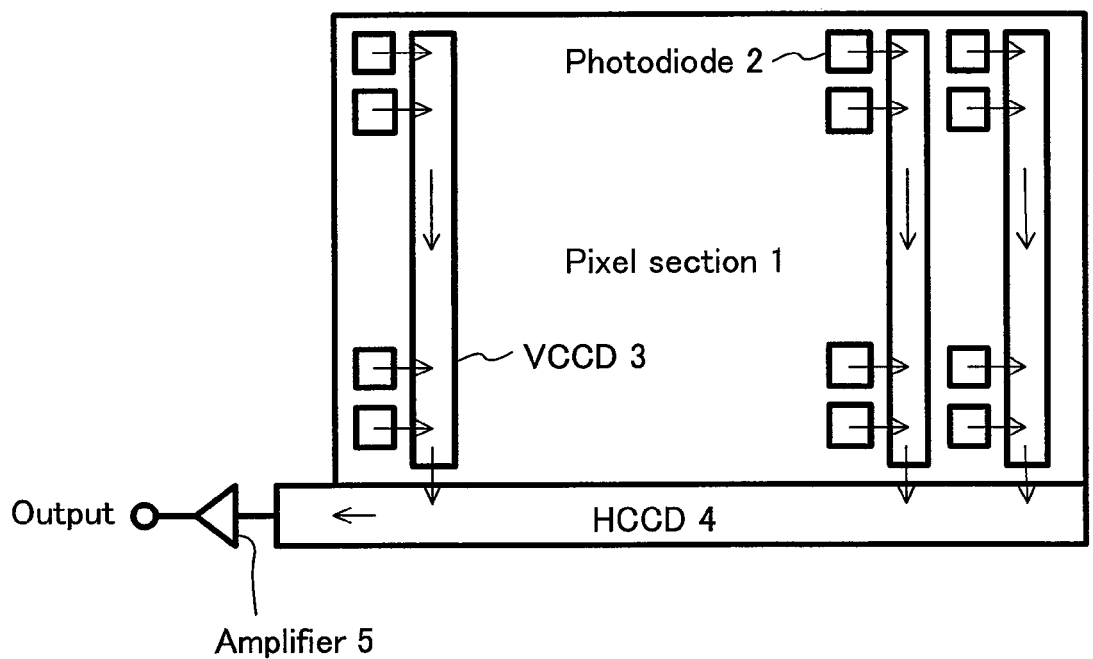
FIG. 1 is an overall view of a solid state imaging device according to first and second embodiments of the present invention.

1 Pixel section
2 Photodiode
3 Vertical transfer portion
4 Horizontal transfer portion
5 Output portion
101 Semiconductor substrate
102 First oxide film
103 First nitride film
104 First gate electrode
105 Second oxide film
106 Sidewall spacer
106A Third oxide film
107 Second nitride film
108 Second gate electrode
201 Semiconductor substrate
202 First oxide film
203 First nitride film
204 First gate electrode
205 Second oxide film
206 Sidewall spacer
206A Third oxide film
207 Second nitride film
208 Second gate electrode
301 Semiconductor substrate
302 First oxide film
303 First nitride film
304 First gate electrode
305 Second oxide film
306 Sidewall spacer
306A Third oxide film
307 Second nitride film
308 Second gate electrode
401 Semiconductor substrate
402 First oxide film
403 First nitride film
404 First gate electrode
405 Second oxide film
406 Sidewall spacer
406A Third oxide film 407 Second nitride film
408 Second gate electrode
501 Semiconductor substrate
502 First oxide film
503 First nitride film
504 First gate electrode
505 Second oxide film
506 Sidewall spacer
506A Third oxide film
507 Second nitride film
508 Second gate electrode
509 Fourth oxide film
510 Sidewall spacer
510A Fifth oxide film
511 Third nitride film
512 Third gate electrode
512A Polysilicon film

BEST MODE FOR CARRYING OUT THE INVENTION

First Embodiment

Hereafter, a solid state imaging device according to a first embodiment of the present invention and a method for fabricating the solid state imaging device will be described in detail with reference to the accompanying drawings. FIG. 1 is an overall view of a solid state imaging device according to this embodiment. As shown in FIG. 1, the solid state imaging device of this embodiment includes a pixel section each including a plurality of pixels arranged in a matrix and a peripheral circuit section provided around the pixel section. In a pixel section 1, photoreceptor portions (photodiodes) 2 each of which is configured to output an electric signal according to an incident light amount and vertical transfer portions (VCCD) 3 each of which is configured to sequentially transfer charges stored in the photodiode 2 in the vertical direction are provided. In the peripheral circuit section, a horizontal transfer portion (HCCD) 4 configured to sequentially transfer charges transferred from the vertical transfer portions 3 in the horizontal direction and an output portion (amplifier) 5 for detecting charges transferred from the horizontal transfer portion 4 and amplifying detected charges are provided.

The principle of operation of the solid state imaging device of this embodiment will be described. Incident light is photoelectric-converted by the photodiode 2, stored for a certain amount of time, and then sent to the transfer portions 3 and 4. In the transfer portions 3 and 4, utilizing a depth of a depletion layer formed in the semiconductor substrate, charges are sequentially transferred from one to another among adjacent parts of the semiconductor substrate which are located under electrodes by application of pulse voltages having different phases to transfer electrodes arranged on the semiconductor substrate so as to be spaced apart from one another with a predetermined distance therebetween. Finally, in the output portion 5, the charges are detected and amplified.

Hereafter, a structure of a transfer portion in the solid state imaging device of this embodiment and a method for forming the transfer portion will be described with reference to FIGS. 2(a) through 2(g). Each transfer portion in the solid state imaging device of this embodiment has a two-layer gate structure. Although only one lower-layer gate electrode (first gate electrode) is illustrated in FIGS. 2(a) through 2(g), a plurality of first gate electrodes are arranged on the semiconductor substrate so as to be spaced apart from one another with a predetermined distance therebetween.

Figure 2:
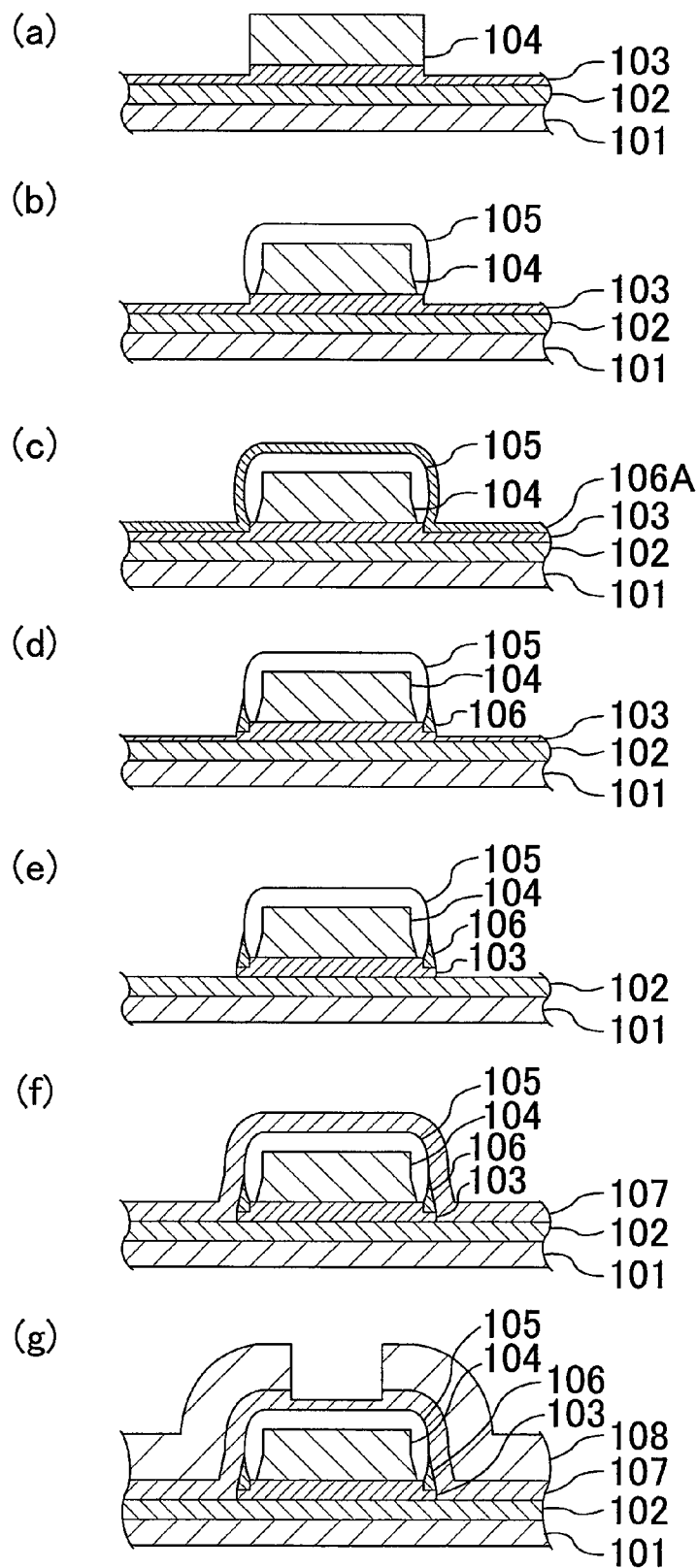
FIGS. 2(a) through 2(g) are cross-sectional views illustrating respective steps of a method for fabricating a solid state imaging device according to the first embodiment of the present invention.

First, as shown in FIG. 2(a), a first oxide film (silicon oxide film) 102 and a first nitride film (silicon nitride film) 103 are formed over a semiconductor substrate 101 so as to be stacked in this order. In this case, the semiconductor substrate 101 may be, for example, a silicon substrate. For example, a p-type or n-type semiconductor layer may be provided on the substrate (hereafter, the substrate including the semiconductor layer will be referred to as the "semiconductor substrate 101"). A channel region is formed at a certain depth from a surface of the semiconductor substrate 101. As the first oxide film 102, for example, a thermally-oxidized film (silicon oxide film) can be used. The thermally-oxidized film is formed, for example, by heat treatment at 850° C. or more so as to have a thickness of about 10-50 nm. As the first nitride film 103, for example, a silicon nitride film can be used. The silicon nitride film is formed, for example, by low pressure CVD (chemical vapor deposition) so as to have a thickness of about 20-100 nm. Next, to form first gate electrodes 104, a conductive film, such as a polysilicon film, is formed on the first nitride film 103. Thereafter, the polysilicon film is patterned using lithography and dry etching, thereby forming first gate electrodes 104 on the first nitride film 103. In this patterning, a certain amount of reduction in film thickness occurs due to the etching in part of the first nitride film 103 other than part thereof located under each of the first gate electrodes 104. Although not shown in FIG. 2(a), a plurality of first gate electrodes 104 are formed on the first nitride film 103 so as to be spaced apart from one another with a predetermined distance therebetween.

Next, as shown in FIG. 2(b), polysilicon forming each of the first gate electrodes 104 is thermally oxidized, thereby forming a second oxide film (silicon oxide film) 105 on upper part and side walls of each of the first gate electrodes 104. Because of a difference between an oxide film growth rate on the first nitride film 103 and an oxide film growth rate on the polysilicon film forming each of the first gate electrodes 104, a surface of the first nitride film 103 is hardly oxidized. As a result, the second oxide film 105 has a smaller thickness on lower part of each side wall of each of the first gate electrodes 104 than a thickness thereof on other part and an overhang shape is generated.

Next, as shown in FIG. 2(c), a third oxide film (silicon oxide film) 106A is formed over the semiconductor substrate 101, for example, by low pressure CVD so as to have a thickness of about 5-50 nm.

Next, as shown in FIG. 2(d), a surface of the third oxide film 106A is entirely etched, for example, by anisotropic dry etching. Thus, a sidewall spacer 106 formed of the third oxide film 106A is buried in an overhang portion generated due to the second oxide film 105 covering each side wall of each of the first gate electrodes 104, so that the overhang shape is modified. At this point, in part of the first nitride film 103 other than part thereof located under each of the first gate electrodes 104, a film thickness is reduced by a certain amount due to the etching.

Next, as shown in FIG. 2(e), part of the first nitride film 103 located between the first gate electrodes 104 is removed by wet etching using phosphoric acid which is highly selective with respect to an oxide film.

Next, as shown in FIG. 2(f), a second nitride film (silicon nitride film) 107 is formed over the semiconductor substrate 101, for example, by low pressure CVD so as to have the same thickness (for example, 20-100 nm) as a thickness of the part of the first nitride film 103 located under each of the first gate electrodes 104. Thus, the second oxide film 105, the sidewall spacer 106 and the part of the first oxide film 102 located between the first gate electrodes 104 are covered by the second nitride film 107.

Next, as shown in FIG. 2(g), to form second gate electrodes 108, for example, a conductive film, such as a polysilicon film, is formed over the semiconductor substrate 101. Then, the polysilicon film is patterned using lithography and etching, thereby forming a plurality of second gate electrodes 108 on at least part of the second nitride film 107 located between adjacent two of the first gate electrodes 104. Each of the second gate electrodes 108 is separated from an associated one of the first gate electrodes 104 by the second oxide film 105, the sidewall spacer 106 and the second nitride film 107 and separated from the semiconductor substrate 101 by the first oxide film 102 and the second nitride film 107.

In this embodiment, the second gate electrodes 108 are formed so that each of the second gate electrodes 108 overlaps with an associated one of the first gate electrodes 104. However, instead of this structure, such an overlapping portion does not have to be provided and the overlapping portion may be removed in a subsequent step.

Figure 3:
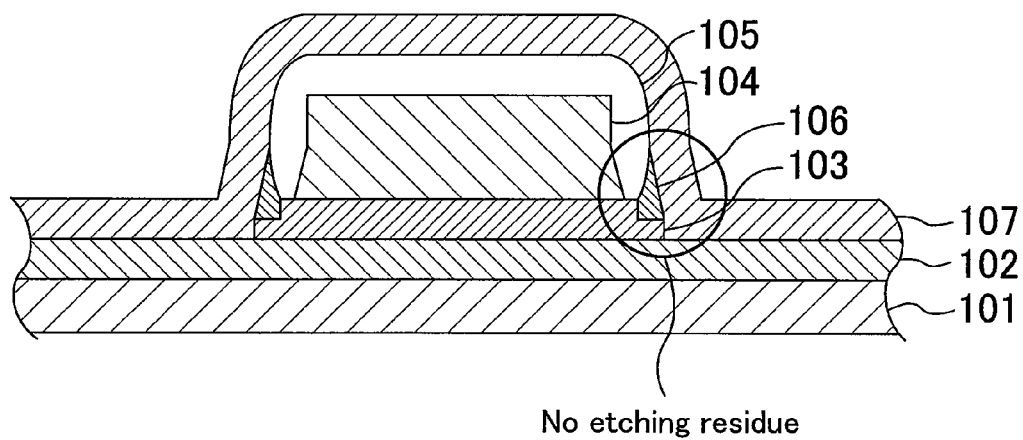
FIG. 3 is a cross-sectional view illustrating a region from which a polysilicon film to serve as a second gate electrode is to be completely removed in each transfer portion of the solid state imaging device of the first embodiment of the present invention.

As has been described, according to this embodiment, the overhang shape generated due to a difference between the oxide film growth rate on, for example, the polysilicon film forming each of the first gate electrodes 104 and the oxide film growth rate on the first nitride film 103 can be modified by forming the sidewall spacer 106 of the third oxide film 106A so as to be buried in the overhang portion generated on each side wall of each of the first gate electrodes 104 covered by the second oxide film 105. Thus, the generation of an etching residue in etching, for example, the polysilicon film forming each of the second gate electrodes 108 can be prevented, so that electrical connection between gate electrodes having different phases can be avoided. Therefore, a high-breakdown voltage solid state imaging device can be obtained. FIG. 3 is a cross-sectional view illustrating a region from which a polysilicon film to form the second gate electrodes 108 is to be completely removed in each transfer portion of the solid state imaging device of this embodiment. As shown in FIG. 3, the generation of a polysilicon etching residue is not observed in the region.

According to this embodiment, a thickness of part of a nitride film located under each of the first gate electrodes 104 and a thickness of part of a nitride film located under each of the second gate electrodes 108 can be set to be the same. Thus, the generation of a difference between potentials under the gate electrodes can be prevented, so that excellent saturated charge amount and transfer efficiency can be maintained.

According to this embodiment, each of the first gate electrodes 104 and an associated one of the second gate electrodes 108 are electrically separated from each other by the second oxide film 105, the sidewall spacer 106 formed of the third oxide film 106A and the second nitride film 107. Thus, a leakage current is much less likely to be generated, so that an inter-gate breakdown voltage is improved.

In this embodiment, as a gate insulating film located under each of the first gate electrodes 104 and the second gate electrodes 108, a two-layer structure (ON structure) including a thermally-oxidized film and a silicon nitride film is used. However, instead of the two-layer structure, a three-layer structure (ONO structure) in which a thermally-oxidized film or a low-pressure CVD oxide film is further formed on the silicon nitride film may be used. Specifically, after formation of the first nitride film 103 and before formation of the first gate electrodes 104, an oxide film may be formed on the first nitride film 103 and, after formation of the second nitride film 107 and before formation of the second gate electrodes 108, an oxide film may be formed on the second nitride film 107.

Second Embodiment

Hereafter, a solid state imaging device according to a second embodiment of the present invention and a method for fabricating the solid state imaging device will be described in detail with reference to the accompanying drawings. An overall structure of the solid state imaging device of this embodiment is the same as that of the first embodiment shown in FIG. 1.

Hereafter, a structure of a transfer portion in the solid state imaging device of this embodiment and a method for forming the transfer portion will be described with reference to FIGS. 4(a) through 4(f). Each transfer portion in the solid state imaging device of this embodiment has a two-layer gate structure. Although only one lower-layer gate electrode (first gate electrode) is illustrated in FIGS. 4(a) through 4(f), a plurality of first gate electrodes are arranged on a semiconductor substrate so as to be spaced apart from one another with a predetermined distance therebetween.

Figure 4:
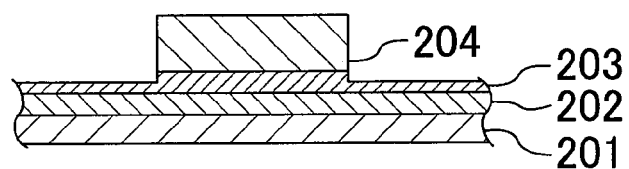
FIGS. 4(a) through 4(f) are cross-sectional views illustrating respective steps of a method for fabricating a solid state imaging device according to a second embodiment of the present invention.
Figure 4:
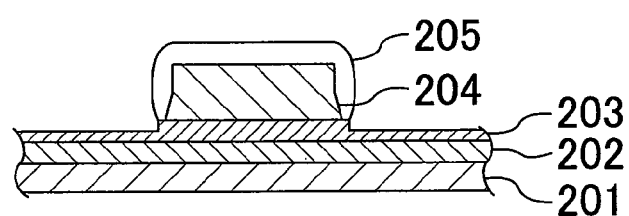
Figure 4:
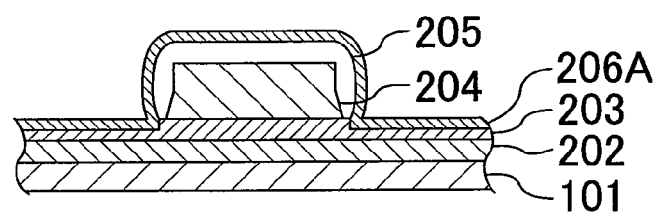
Figure 4:
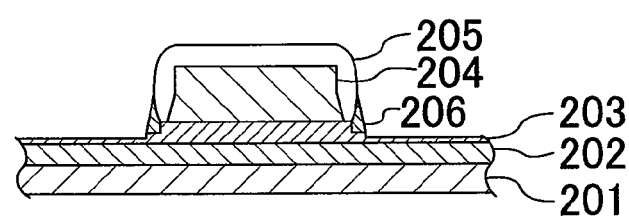
Figure 4:
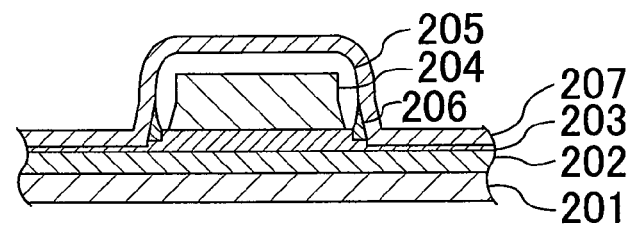
Figure 4:
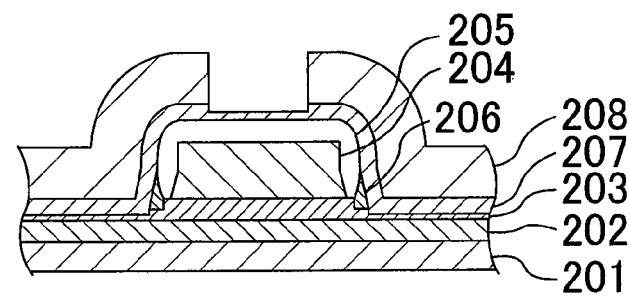

First, as shown in FIG. 4(a), a first oxide film (silicon oxide film) 202 and a first nitride film (silicon nitride film) 203 are formed over a semiconductor substrate 201 so as to be stacked in this order. In this case, the semiconductor substrate 201 may be, for example, a silicon substrate. For example, a p-type or n-type semiconductor layer may be provided on the substrate (hereafter, the substrate including the semiconductor layer will be referred to as the "semiconductor substrate 201"). A channel region is formed at a certain depth from a surface of the semiconductor substrate 201. As the first oxide film 202, for example, a thermally-oxidized film (silicon oxide film) can be used. The thermally-oxidized film is formed, for example, by heat treatment at 850° C. or more so as to have a thickness of about 10-50 nm. As the first nitride film 203, for example, a silicon nitride film can be used. The silicon nitride film is formed, for example, by low pressure CVD so as to have a thickness of about 20-100 nm. Next, to form first gate electrodes 204, a conductive film, such as a polysilicon film, is formed on the first nitride film 203. Thereafter, the polysilicon film is patterned using lithography and dry etching, thereby forming first gate electrodes 204 on the first nitride film 203. In this patterning, a certain amount of reduction in film thickness occurs due to the etching in part of the first nitride film 203 other than part thereof located under each of the first gate electrodes 204. Although not shown in FIG. 4(a), a plurality of first gate electrodes 204 are formed on the first nitride film 203 so as to be spaced apart from one another with a predetermined distance therebetween.

Next, as shown in FIG. 4(b), polysilicon forming each of the first gate electrodes 204 is thermally oxidized, thereby forming a second oxide film (silicon oxide film) 205 on upper part and side walls of each of the first gate electrodes 204. Because of a difference between an oxide film growth rate on the first nitride film 203 and an oxide film growth rate on the polysilicon film forming each of the first gate electrodes 204, a surface of the first nitride film 203 is hardly oxidized. As a result, the second oxide film 205 has a smaller thickness on lower part of each side wall of each of the first gate electrodes 204 than a thickness thereof on other part and an overhang shape is generated.

Next, as shown in FIG. 4(c), a third oxide film (silicon oxide film) 206A is formed over the semiconductor substrate 201, for example, by low pressure CVD so as to have a thickness of about 5-50 nm.

Next, as shown in FIG. 4(d), a surface of the third oxide film 206A is entirely etched, for example, by anisotropic dry etching. Thus, a sidewall spacer 206 formed of the third oxide film 206A is buried in an overhang portion generated due to the second oxide film 205 covering each side wall of each of the first gate electrodes 204, so that the overhang shape is modified. At this point, in part of the first nitride film 203 other than part thereof located under each of the first gate electrodes 204, a film thickness is reduced by a certain amount due to the etching.

Next, as shown in FIG. 4(e), a second nitride film 207 is formed over the semiconductor substrate 201 so as to have a thickness corresponding to the amount of reduction in film thickness of the first nitride film 203 due to the etching. Thus, the second oxide film 205, the sidewall spacer 206 formed of the third oxide film 206A and part of the first nitride film 203 located between the first gate electrodes 204 are covered by the second nitride film 207. As the second nitride film 207, for example, a silicon nitride film can be used. The silicon nitride film is formed, for example, by low pressure CVD, so that a thickness of part of the first nitride film 203 located under each of the first gate electrodes 204 and a total of respective thicknesses of parts of the first nitride film 203 and the second nitride film 207 other than the parts thereof located under each of the first gate electrodes 204 are set to be the same.

Next, as shown in FIG. 4(f), to form second gate electrodes 208, for example, a conductive film, such as a polysilicon film, is formed over the semiconductor substrate 201. Then, the polysilicon film is patterned using lithography and etching, thereby forming a plurality of second gate electrodes 208 on at least part of the second nitride film 207 located between adjacent two of the first gate electrodes 204. Each of the second gate electrodes 208 is separated from an associated one of the first gate electrodes 204 by the second oxide film 205, the sidewall spacer 206 and the second nitride film 207 and separated from the semiconductor substrate 201 by the first oxide film 202, the first nitride film 203 and the second nitride film 207.

In this embodiment, the second gate electrodes 208 are formed so that each of the second gate electrodes 208 overlaps with an associated one of the first gate electrodes 204. However, instead of this structure, such an overlapping portion does not have to be provided and the overlapping portion may be removed in a subsequent step.

Figure 5:
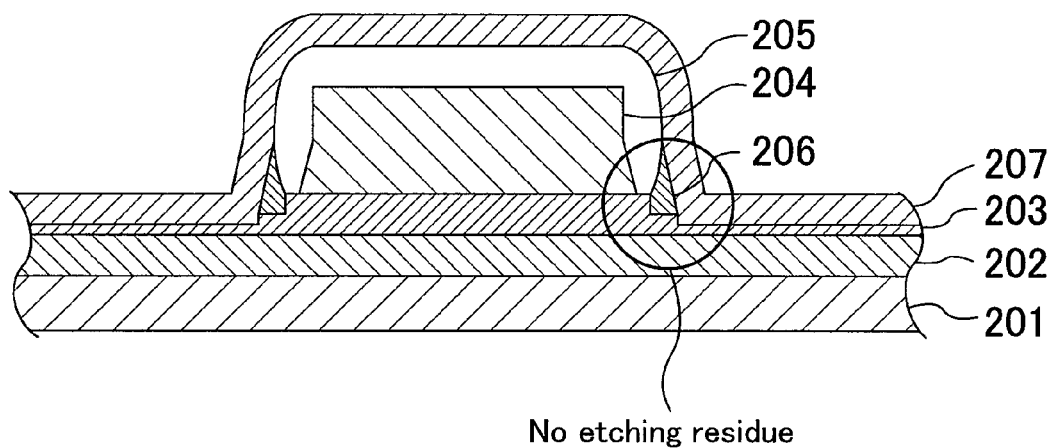
FIG. 5 is a cross-sectional view illustrating a region from which a polysilicon film to serve as a second gate electrode is to be completely removed in each transfer portion of the solid state imaging device of the second embodiment of the present invention.

As has been described, according to this embodiment, the overhang shape generated due to a difference between the oxide film growth rate on, for example, the polysilicon film forming each of the first gate electrodes 204 and the oxide film growth rate on the first nitride film 203 can be modified by forming the sidewall spacer 206 of the third oxide film 206A so as to be buried in the overhang portion generated on each side wall of each of the first gate electrodes 204 covered by the second oxide film 205. Thus, the generation of an etching residue in etching, for example, the polysilicon film forming each of the second gate electrodes 208 can be prevented, so that electrical connection between gate electrodes having different phases can be avoided. Therefore, a high-breakdown voltage solid state imaging device can be obtained. FIG. 5 is a cross-sectional view illustrating a region from which a polysilicon film to form the second gate electrodes 208 is to be completely removed in each transfer portion of the solid state imaging device of this embodiment. As shown in FIG. 5, the generation of a polysilicon etching residue is not observed in the region.

According to this embodiment, the part of the first nitride film 203 other than the part thereof located under each of the first gate electrodes 204 is not removed and the second nitride film 207 is newly formed so as to have a thickness corresponding to the amount of reduction in film thickness of the first nitride film 203 caused in a previous process step such as etching. Thus, a nitride film located under each of the first gate electrodes 204 and a nitride film located under each of the second gate electrodes 208 can be formed of a continuous film (i.e., the first nitride film 203) to which the same heat treatment has been performed. Therefore, a solid state imaging device having excellent transfer efficiency can be obtained.

According to this embodiment, a thickness of part of a nitride film located under each of the first gate electrodes 204 and a thickness of part of a nitride film located under each of the second gate electrodes 208 can be set to be the same. Thus, the generation of a difference between potentials under the gate electrodes can be prevented, so that excellent saturated charge amount and transfer efficiency can be maintained.

According to this embodiment, each of the first gate electrodes 204 and an associated one of the second gate electrodes 208 are electrically separated from each other by the second oxide film 205, the sidewall spacer 206 formed of the third oxide film 206A and the second nitride film 207. Thus, a leakage current is much less likely to be generated, so that an inter-gate breakdown voltage is improved.

In this embodiment, as a gate insulating film located under each of the gate electrodes 204 and 208, a two-layer structure (ON structure) including a thermally-oxidized film and a silicon nitride film is used. However, instead of the two-layer structure, a three-layer structure (ONO structure) in which a thermally-oxidized film or a low-pressure CVD oxide film is further formed on the silicon nitride film may be used. Specifically, after formation of the first nitride film 203 and before formation of the first gate electrodes 204, an oxide film may be formed on the first nitride film 203, and after formation of the second nitride film 207 and before formation of the second gate electrodes 208, an oxide film may be formed on the second nitride film 207.

According to this embodiment, a thickness of the second nitride film 207 formed according to the amount of reduction in film thickness of the first nitride film 203 is not particularly limited but, for example, is about 2 nm or more and about 35 nm or less. Specifically, the amount of reduction in film thickness of the first nitride film 203 may be predicted, for example, by a statistical technique and, on the basis of a result of the prediction, the thickness of the second nitride film 207 may be set. Alternatively, the amount of reduction in film thickness of the first nitride film 203 may be actually measured and, on the basis of a result of the measurement, the thickness of the second nitride film 207 may be set.

Third Embodiment

Hereafter, a solid state imaging device according to a third embodiment of the present invention and a method for fabricating the solid state imaging device will be described in detail with reference to the accompanying drawings. An overall structure of the solid state imaging device of this embodiment is the same as that of the first embodiment shown in FIG. 1.

Hereafter, a structure of a transfer portion in the solid state imaging device of this embodiment and a method for forming the transfer portion will be described with reference to FIGS. 6(a) through 6(g). Each transfer portion in the solid state imaging device of this embodiment has a two-layer gate structure. Although only one lower-layer gate electrode (first gate electrode) is illustrated in FIGS. 6(a) through 6(g), a plurality of first gate electrodes are arranged on a semiconductor substrate so as to be spaced apart from one another with a predetermined distance therebetween.

Figure 6:
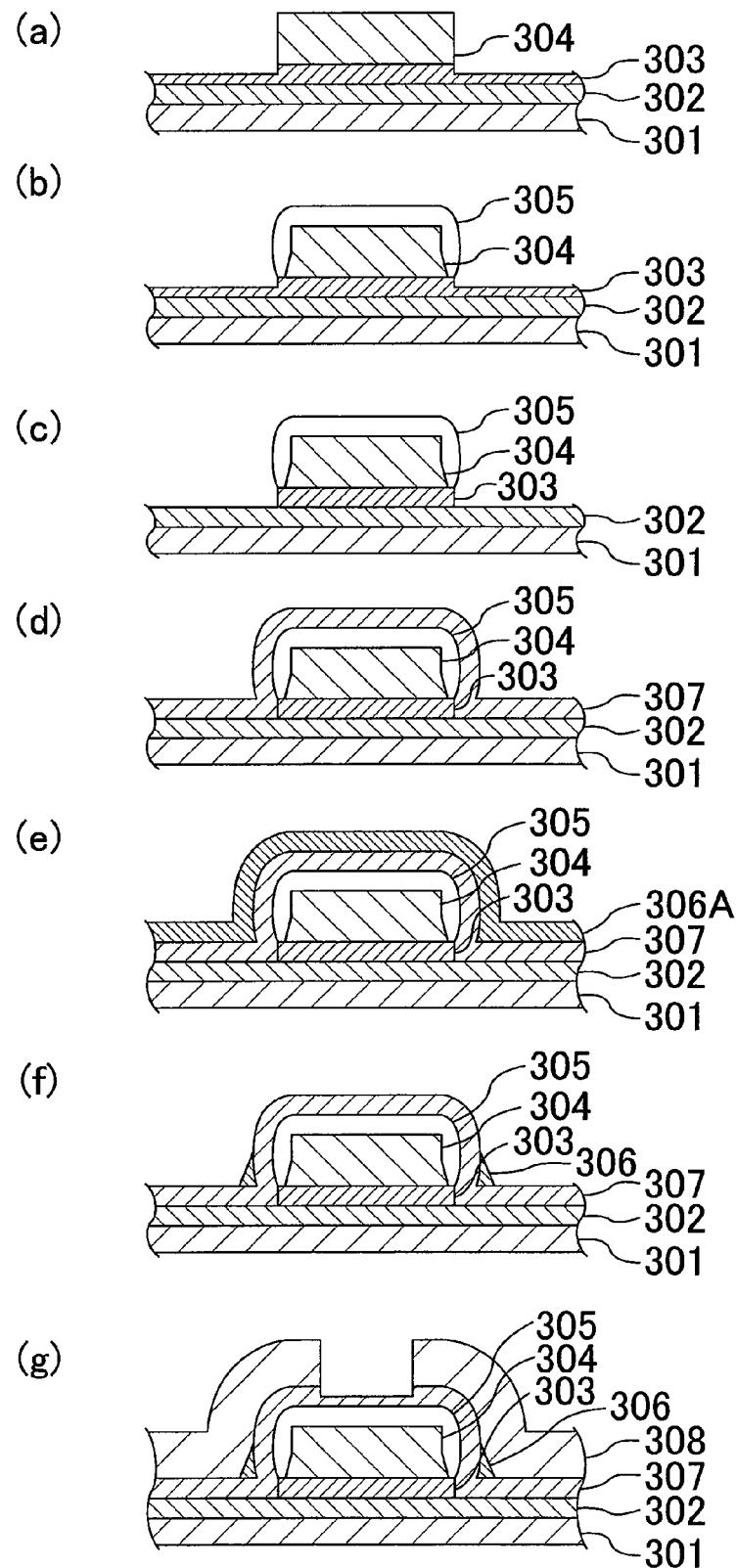
FIGS. 6(a) through 6(g) are cross-sectional views illustrating respective steps of a method for fabricating a solid state imaging device according to a third embodiment of the present invention.

First, as shown in FIG. 6(a), a first oxide film (silicon oxide film) 302 and a first nitride film (silicon nitride film) 303 are formed over a semiconductor substrate 301 so as to be stacked in this order. In this case, the semiconductor substrate 301 may be, for example, a silicon substrate. For example, a p-type or n-type semiconductor layer may be provided on the substrate (hereafter, the substrate including the semiconductor layer will be referred to as the "semiconductor substrate 301"). A channel region is formed at a certain depth from a surface of the semiconductor substrate 301. As the first oxide film 302, for example, a thermally-oxidized film (silicon oxide film) can be used. The thermally-oxidized film is formed, for example, by heat treatment at 850° C. or more so as to have a thickness of about 10-50 nm. As the first nitride film 303, for example, a silicon nitride film can be used. The silicon nitride film is formed, for example, by low pressure CVD so as to have a thickness of about 20-100 nm. Next, to form first gate electrodes 304, a conductive film, such as a polysilicon film, is formed on the first nitride film 303. Thereafter, the polysilicon film is patterned using lithography and dry etching, thereby forming first gate electrodes 304 on the first nitride film 303. In this patterning, a certain amount of reduction in film thickness occurs due to the etching in part of the first nitride film 303 other than part thereof located under each of the first gate electrodes 304. Although not shown in FIG. 6(a), a plurality of first gate electrodes 304 are formed on the first nitride film 303 so as to be spaced apart from one another with a predetermined distance therebetween.

Next, as shown in FIG. 6(b), polysilicon forming each of the first gate electrodes 304 is thermally oxidized, thereby forming a second oxide film (silicon oxide film) 305 on upper part and side walls of each of the first gate electrodes 304. Because of a difference between an oxide film growth rate on the first nitride film 303 and an oxide film growth rate on the polysilicon film forming each of the first gate electrodes 304, a surface of the first nitride film 303 is hardly oxidized. As a result, the second oxide film 305 has a smaller thickness on lower part of each side wall of each of the first gate electrodes 304 than a thickness thereof on other part and an overhang shape is generated.

Next, as shown in FIG. 6(c), part of the first nitride film 303 located between the first gate electrodes 304 is removed by wet etching using phosphoric acid which is highly selective with respect to an oxide film.

Next, as shown in FIG. 6(d), a second nitride film (silicon nitride film) 307 is formed over the semiconductor substrate 301, for example, by low pressure CVD so as to have the same thickness (for example, 20-100 nm) as a thickness of the part of the first nitride film 303 located under each of the first gate electrodes 304. Thus, the second oxide film 305 and the part of the first oxide film 302 located between the first gate electrodes 304 are covered by the second nitride film 307.

Next, as shown in FIG. 6(e), a third oxide film (silicon oxide film) 306A is formed over the semiconductor substrate 301, for example, by low pressure CVD so as to have a thickness of about 5-50 nm.

Next, as shown in FIG. 6(f), a surface of the third oxide film 306A is entirely etched, for example, by anisotropic dry etching. Thus, a sidewall spacer 306 formed of the third oxide film 306A is buried in an overhang portion generated on each side wall of each of the first gate electrodes 304 covered by the second oxide film 305 and the second nitride film 307, so that the overhang shape is modified.

Next, as shown in FIG. 6(g), to form second gate electrodes 308, for example, a conductive film, such as a polysilicon film, is formed over the semiconductor substrate 301. Then, the polysilicon film is patterned using lithography and etching, thereby forming a plurality of second gate electrodes 308 on at least part of the second nitride film 306 located between adjacent two of the first gate electrodes 304. Each of the second gate electrodes 308 is separated from an associated one of the first gate electrodes 304 by the second oxide film 305, the second nitride film 307 and the sidewall spacer 306 and separated from the semiconductor substrate 301 by the first oxide film 302 and the second nitride film 307.

In this embodiment, the second gate electrodes 308 are formed so that each of the second gate electrodes 308 overlaps with an associated one of the first gate electrodes 304. However, instead of this structure, such an overlapping portion does not have to be provided and the overlapping portion may be removed in a subsequent step.

Figure 7:
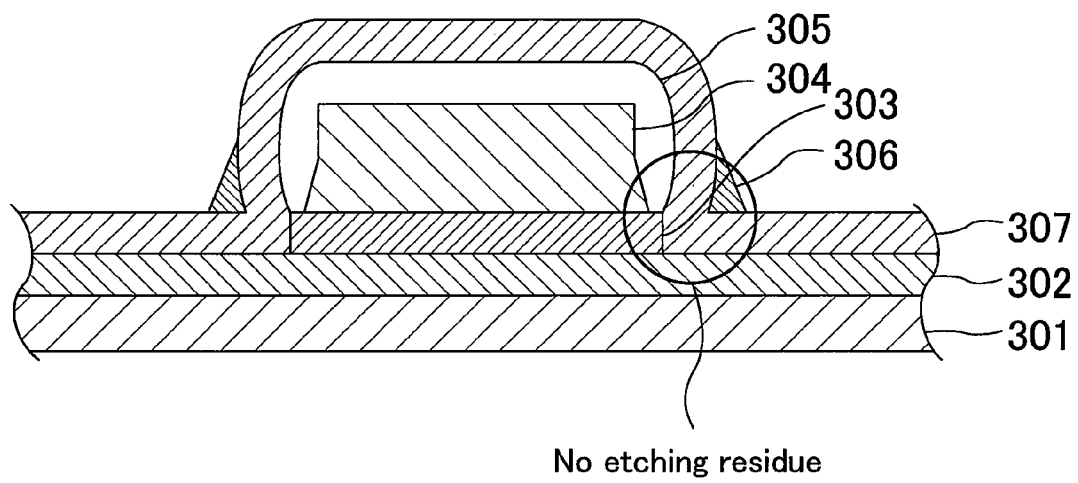
FIG. 7 is a cross-sectional view illustrating a region from which a polysilicon film to serve as a second gate electrode is to be completely removed in each transfer portion of the solid state imaging device of the third embodiment of the present invention.

As has been described, according to this embodiment, the overhang shape generated due to a difference between the oxide film growth rate on, for example, the polysilicon film forming each of the first gate electrodes 304 and the oxide film growth rate on the first nitride film 303 can be modified by forming the sidewall spacer 306 of the third oxide film 306A so as to be buried in the overhang portion generated on each side wall of each of the first gate electrodes 304 covered by the second oxide film 305 and the second nitride film 307. Thus, the generation of an etching residue in etching, for example, the polysilicon film forming each of the second gate electrodes 308 can be prevented, so that electrical connection between gate electrodes having different phases can be avoided. Therefore, a high-breakdown voltage solid state imaging device can be obtained. FIG. 7 is a cross-sectional view illustrating a region from which a polysilicon film to form the second gate electrodes 308 is to be completely removed in each transfer portion of the solid state imaging device of this embodiment. As shown in FIG. 7, the generation of a polysilicon etching residue is not observed in the region.

According to this embodiment, a thickness of part of a nitride film located under each of the first gate electrodes 304 and a thickness of part of a nitride film located under each of the second gate electrodes 308 can be set to be the same. Thus, the generation of a difference between potentials under the gate electrodes can be prevented, so that excellent saturated charge amount and transfer efficiency can be maintained.

According to this embodiment, each of the first gate electrodes 304 and an associated one of the second gate electrodes 308 are electrically separated from each other by the second oxide film 305, the second nitride film 307 and the sidewall spacer 306 formed of the third oxide film 306A. Thus, a leakage current is much less likely to be generated, so that an inter-gate breakdown voltage is improved.

In this embodiment, as a gate insulating film located under each of the gate electrodes 304 and 308, a two-layer structure (ON structure) including a thermally-oxidized film and a silicon nitride film is used. However, instead of the two-layer structure, a three-layer structure (ONO structure) in which a thermally-oxidized film or a low-pressure CVD oxide film is further formed on the silicon nitride film may be used. Specifically, after formation of the first nitride film 303 and before formation of the first gate electrodes 304, an oxide film may be formed on the first nitride film 303, and after formation of the second nitride film 307 and before formation of the second gate electrodes 308, an oxide film may be formed on the second nitride film 307.

Fourth Embodiment

Hereafter, a solid state imaging device according to a fourth embodiment of the present invention and a method for fabricating the solid state imaging device will be described in detail with reference to the accompanying drawings. An overall structure of the solid state imaging device of this embodiment is the same as that of the first embodiment shown in FIG. 1.

Hereafter, a structure of a transfer portion in the solid state imaging device of this embodiment and a method for forming the transfer portion will be described with reference to FIGS. 8(a) through 8(f). Each transfer portion in the solid state imaging device of this embodiment has a two-layer gate structure. Although only one lower-layer gate electrode (first gate electrode) is illustrated in FIGS. 8(a) through 8(f), a plurality of first gate electrodes are arranged on a semiconductor substrate so as to be spaced apart from one another with a predetermined distance therebetween.

Figure 8:
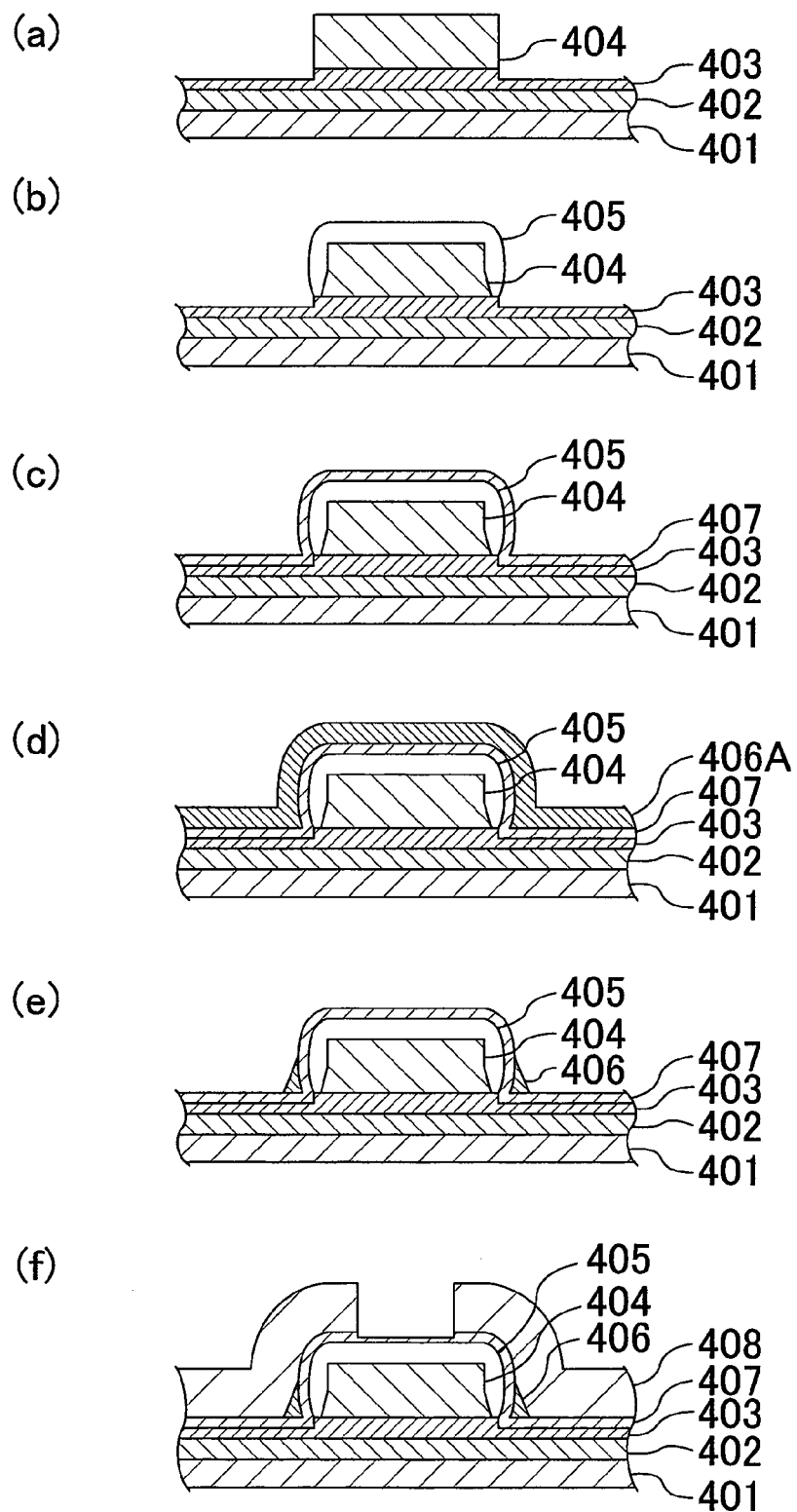
FIGS. 8(a) through 8(f) are cross-sectional views illustrating respective steps of a method for fabricating a solid state imaging device according to a fourth embodiment of the present invention.

First, as shown in FIG. 8(a), a first oxide film (silicon oxide film) 402 and a first nitride film (silicon nitride film) 403 are formed over a semiconductor substrate 401 so as to be stacked in this order. In this case, the semiconductor substrate 401 may be, for example, a silicon substrate. For example, a p-type or n-type semiconductor layer may be provided on the substrate (hereafter, the substrate including the semiconductor layer will be referred to as the "semiconductor substrate 401"). A channel region is formed at a certain depth from a surface of the semiconductor substrate 401. As the first oxide film 402, for example, a thermally-oxidized film (silicon oxide film) can be used. The thermally-oxidized film is formed, for example, by heat treatment at 850° C. or more so as to have a thickness of about 10-50 nm. As the first nitride film 403, for example, a silicon nitride film can be used. The silicon nitride film is formed, for example, by low pressure CVD so as to have a thickness of about 20-100 nm. Next, to form first gate electrodes 404, a conductive film, such as a polysilicon film, is formed on the first nitride film 403. Thereafter, the polysilicon film is patterned using lithography and dry etching, thereby forming first gate electrodes 404 on the first nitride film 403. In this patterning, a certain amount of reduction in film thickness occurs due to the etching in part of the first nitride film 403 other than part thereof located under each of the first gate electrodes 404. Although not shown in FIG. 8(a), a plurality of first gate electrodes 404 are formed on the first nitride film 403 so as to be spaced apart from one another with a predetermined distance therebetween.

Next, as shown in FIG. 8(b), polysilicon forming each of the first gate electrodes 404 is thermally oxidized, thereby forming a second oxide film (silicon oxide film) 405 on upper part and side walls of each of the first gate electrodes 404. Because of a difference between an oxide film growth rate on the first nitride film 403 and an oxide film growth rate on the polysilicon film forming each of the first gate electrodes 404, a surface of the first nitride film 403 is hardly oxidized. As a result, the second oxide film 405 has a smaller thickness on lower part of each side wall of each of the first gate electrodes 404 than a thickness thereof on other part and an overhang shape is generated.

Next, as shown in FIG. 8(c), a second nitride film 407 is formed over the semiconductor substrate 401 so as to have a thickness corresponding to the amount of reduction in film thickness of the first nitride film 403 due to the etching. Thus, the second oxide film 405 and part of the first nitride film 403 located between the first gate electrodes 404 are covered by the second nitride film 407. As the second nitride film 407, for example, a silicon nitride film can be used. The silicon nitride film is formed, for example, by low pressure CVD, so that a thickness of part of the first nitride film 403 located under each of the first gate electrodes 404 and a total of respective thicknesses of parts of the first nitride film 403 and the second nitride film 407 other than the parts thereof located under each of the first gate electrodes 404 are set to be the same.

Next, as shown in FIG. 8(d), a third oxide film (silicon oxide film) 406A is formed over the semiconductor substrate 401, for example, by low pressure CVD so as to have a thickness of about 5-50 nm.

Next, as shown in FIG. 8(e), a surface of the third oxide film 406A is entirely etched, for example, by anisotropic dry etching. Thus, a sidewall spacer 406 formed of the third oxide film 406A is buried in an overhang portion generated on each side wall of the each of the first gate electrodes 404 covered by the second oxide film 405 and the second nitride film 407, so that the overhang shape is modified.

Next, as shown in FIG. 8(f), to form second gate electrodes 408, for example, a conductive film, such as a polysilicon film, is formed over the semiconductor substrate 401. Then, the polysilicon film is patterned using lithography and etching, thereby forming a plurality of second gate electrodes 408 on at least part of the second nitride film 407 located between adjacent two of the first gate electrodes 404. Each of the second gate electrodes 408 is separated from an associated one of the first gate electrodes 404 by the second oxide film 405, the second nitride film 407 and the sidewall spacer 406 and separated from the semiconductor substrate 401 by the first oxide film 402, the first nitride film 403 and the second nitride film 407.

In this embodiment, the second gate electrodes 408 are formed so that each of the second gate electrodes 408 overlaps with an associated one of the first gate electrodes 404. However, instead of this structure, such an overlapping portion does not have to be provided and the overlapping portion may be removed in a subsequent step.

Figure 9:
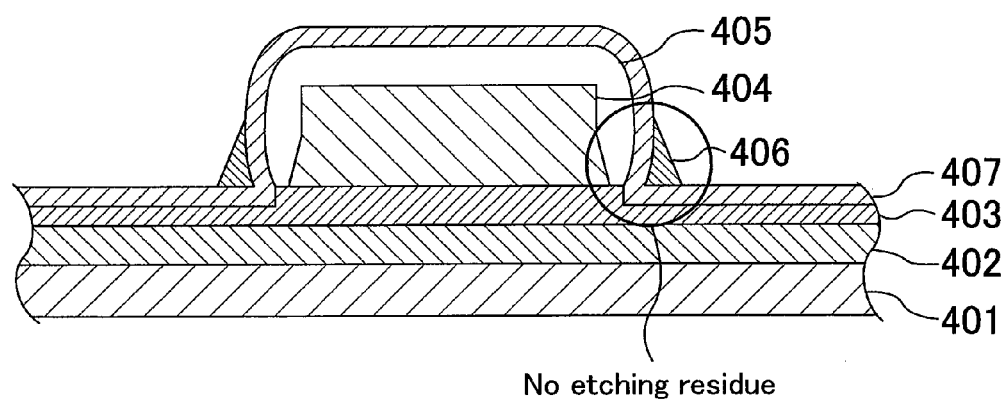
FIG. 9 is a cross-sectional view illustrating a region from which a polysilicon film to serve as a second gate electrode is to be completely removed in each transfer portion of the solid state imaging device of the fourth embodiment of the present invention.

As has been described, according to this embodiment, the overhang shape generated due to a difference between the oxide film growth rate on, for example, the polysilicon film forming each of the first gate electrodes 404 and the oxide film growth rate on the first nitride film 403 can be modified by forming the sidewall spacer 406 of the third oxide film 406A so as to be buried in the overhang portion generated on each side wall of each of the first gate electrodes 404 covered by the second oxide film 405 and the second nitride film 407. Thus, the generation of an etching residue in etching, for example, the polysilicon film forming each of the second gate electrodes 408 can be prevented, so that electrical connection between gate electrodes having different phases can be avoided. Therefore, a high-breakdown voltage solid state imaging device can be obtained. FIG. 9 is a cross-sectional view illustrating a region from which a polysilicon film to form the second gate electrodes 408 is to be completely removed in each transfer portion of the solid state imaging device of this embodiment. As shown in FIG. 9, the generation of a polysilicon etching residue is not observed in the region.

According to this embodiment, the part of the first nitride film 403 other than the part thereof located under each of the first gate electrodes 404 is not removed and the second nitride film 407 is newly formed so as to have a thickness corresponding to the amount of reduction in film thickness of the first nitride film 403 caused in a previous process step such as etching. Thus, a nitride film located under each of the first gate electrodes 404 and a nitride film located under each of the second gate electrodes 408 can be formed of a continuous film (i.e., the first nitride film 403) to which the same heat treatment has been performed. Therefore, a solid state imaging device having excellent transfer efficiency can be obtained.

According to this embodiment, a thickness of part of a nitride film located under each of the first gate electrodes 404 and a thickness of part of a nitride film located under each of the second gate electrodes 408 can be set to be the same. Thus, the generation of a difference between potentials under the gate electrodes can be prevented, so that excellent saturated charge amount and transfer efficiency can be maintained.

According to this embodiment, each of the first gate electrodes 404 and an associated one of the second gate electrodes 408 are electrically separated from each other by the second oxide film 405, the second nitride film 407 and the sidewall spacer 406 formed of the third oxide film 406A. Thus, a leakage current is much less likely to be generated, so that an inter-gate breakdown voltage is improved.

In this embodiment, as a gate insulating film located under each of the gate electrodes 404 and 408, a two-layer structure (ON structure) including a thermally-oxidized film and a silicon nitride film is used. However, instead of the two-layer structure, a three-layer structure (ONO structure) in which a thermally-oxidized film or a low-pressure CVD oxide film is further formed on the silicon nitride film may be used. Specifically, after formation of the first nitride film 403 and before formation of the first gate electrodes 404, an oxide film may be formed on the first nitride film 403, and after formation of the second nitride film 407 and before formation of the second gate electrodes 408, an oxide film may be formed on the second nitride film 407.

According to this embodiment, a thickness of the second nitride film 407 formed according to the amount of reduction in film thickness of the first nitride film 403 is not particularly limited but, for example, is about 2 nm or more and about 35 nm or less. Specifically, the amount of reduction in film thickness of the first nitride film 403 may be predicted, for example, by a statistical technique and, on the basis of a result of the prediction, the thickness of the second nitride film 407 may be set. Alternatively, the amount of reduction in film thickness of the first nitride film 403 may be actually measured and, on the basis of a result of the measurement, the thickness of the second nitride film 407 may be set.

Fifth Embodiment

Hereafter, a solid state imaging device according to a fifth embodiment of the present invention and a method for fabricating the solid state imaging device will be described in detail with reference to the accompanying drawings. An overall structure of the solid state imaging device of this embodiment is the same as that of the first embodiment shown in FIG. 1.

Hereafter, a structure of a transfer portion in the solid state imaging device of this embodiment and a method for forming the transfer portion will be described with reference to FIGS. 10(a) through 10(g), FIGS. 11(a) through 11(e) and FIGS. 12(a) and 12(b). Each transfer portion in the solid state imaging device of this embodiment has a three-layer gate structure. Although only one lower-layer gate electrode (first gate electrode) is illustrated in FIGS. 10(a) through 10(g), FIGS. 11(a) through 11(e) and FIGS. 12(a) and 12(b), a plurality of first gate electrodes are arranged on a semiconductor substrate so as to be spaced apart from one another with a predetermined distance therebetween.

Figure 10:
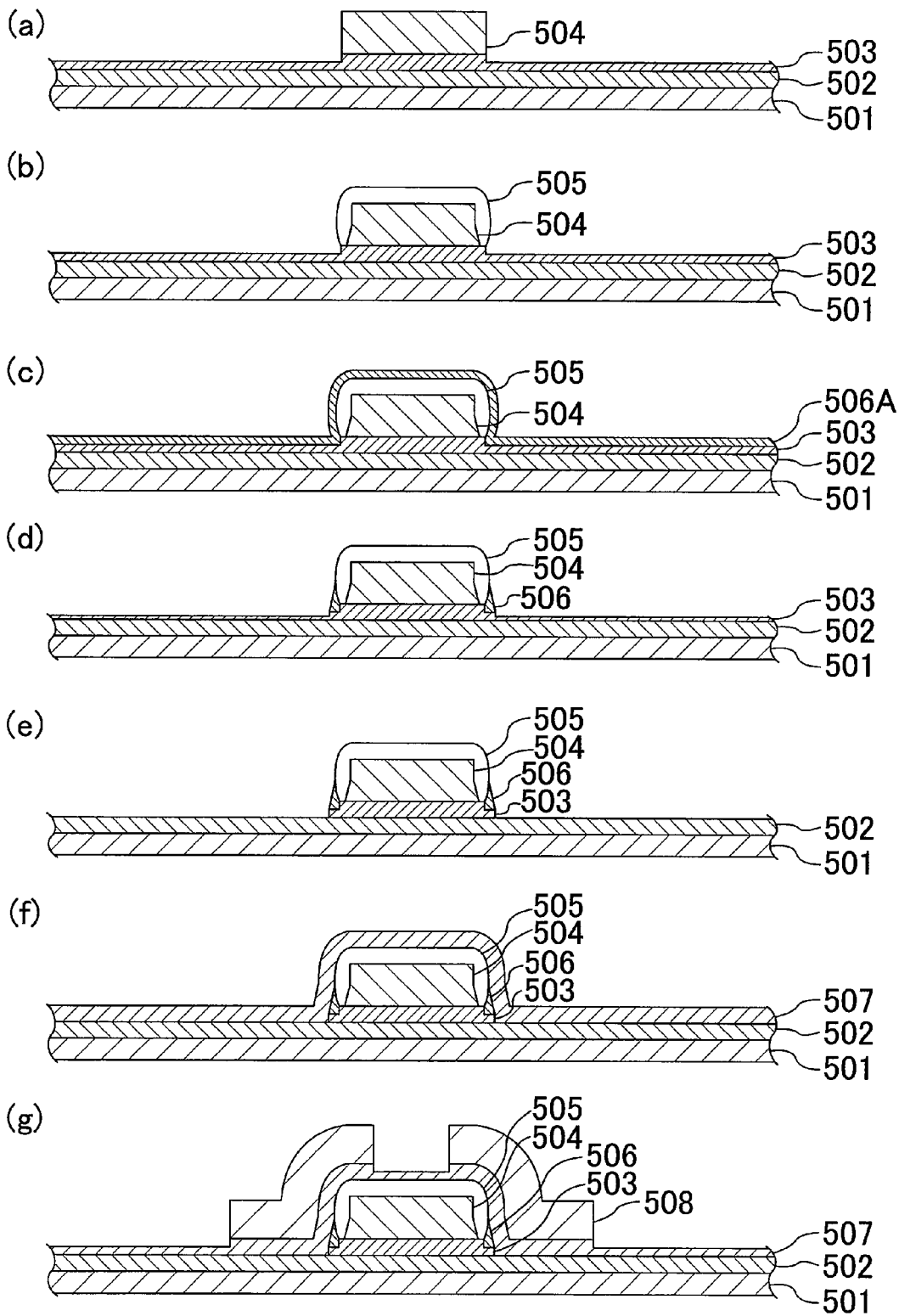
FIGS. 10(a) through 10(g) are cross-sectional views illustrating respective steps of a method for fabricating a solid state imaging device according to a fifth embodiment of the present invention.

First, as shown in FIG. 10(a), a first oxide film (silicon oxide film) 502 and a first nitride film (silicon nitride film) 503 are formed over a semiconductor substrate 501 so as to be stacked in this order. In this case, the semiconductor substrate 501 may be, for example, a silicon substrate. For example, a p-type or n-type semiconductor layer may be provided on the substrate (hereafter, the substrate including the semiconductor layer will be referred to as the "semiconductor substrate 501"). A channel region is formed at a certain depth from a surface of the semiconductor substrate 501. As the first oxide film 502, for example, a thermally-oxidized film (silicon oxide film) can be used. The thermally-oxidized film is formed, for example, by heat treatment at 850° C. or more so as to have a thickness of about 10-50 nm. As the first nitride film 503, for example, a silicon nitride film can be used. The silicon nitride film is formed, for example, by low pressure CVD so as to have a thickness of about 20-100 nm. Next, to form first gate electrodes 504, a conductive film, such as a polysilicon film, is formed on the first nitride film 503. Thereafter, the polysilicon film is patterned using lithography and dry etching, thereby forming first gate electrodes 504 on the first nitride film 503. In this patterning, a certain amount of reduction in film thickness occurs due to the etching in part of the first nitride film 503 other than part thereof located under each of the first gate electrodes 504. Although not shown in FIG. 10(a), a plurality of first gate electrodes 504 are formed on the first nitride film 503 so as to be spaced apart from one another with a predetermined distance therebetween.

Next, as shown in FIG. 10(b), polysilicon forming each of the first gate electrodes 504 is thermally oxidized, thereby forming a second oxide film (silicon oxide film) 505 on upper part and side walls of each of the first gate electrodes 504. Because of a difference between an oxide film growth rate on the first nitride film 503 and an oxide film growth rate on the polysilicon film forming each of the first gate electrodes 504, a surface of the first nitride film 503 is hardly oxidized. As a result, the second oxide film 505 has a smaller thickness on lower part of each side wall of each of the first gate electrodes 504 than a thickness thereof on other part and an overhang shape is generated.

Next, as shown in FIG. 10(c), a third oxide film (silicon oxide film) 506A is formed over the semiconductor substrate 501, for example, by low pressure CVD so as to have a thickness of about 5-50 nm.

Next, as shown in FIG. 10(d), a surface of the third oxide film 506A is entirely etched, for example, by anisotropic dry etching. Thus, a first sidewall spacer 506 formed of the third oxide film 506A is buried in an overhang portion generated due to the second oxide film 505 covering each side wall of each of the first gate electrodes 504, so that the overhang shape is modified. At this point, in part of the first nitride film 503 other than part thereof located under each of the first gate electrodes 504, a film thickness is reduced by a certain amount due to the etching.

Next, as shown in FIG. 10(e), part of the first nitride film 503 located between the first gate electrodes 504 is removed by wet etching using phosphoric acid which is highly selective with respect to an oxide film.

Next, as shown in FIG. 10(f), a second nitride film (silicon nitride film) 507 is formed over the semiconductor substrate 501, for example, by low pressure CVD so as to have the same thickness (for example, 20-100 nm) as a thickness of the part of the first nitride film 503 located under each of the first gate electrodes 504. Thus, the second oxide film 505, the first sidewall spacer 506 and the part of the first oxide film 502 located between the first gate electrodes 504 are covered by the second nitride film 507.

Next, as shown in FIG. 10(g), to form second gate electrodes 508, for example, a conductive film, such as a polysilicon film, is formed over the semiconductor substrate 501. Then, the polysilicon film is patterned using lithography and etching, thereby forming a plurality of second gate electrodes 508 on at least part of the second nitride film 507 located between adjacent two of the first gate electrodes 504. Each of the second gate electrodes 508 is separated from an associated one of the first gate electrodes 504 by the second oxide film 505, the first sidewall spacer 506 and the second nitride film 507 and separated from the semiconductor substrate 501 by the first oxide film 502 and the second nitride film 507.

In this embodiment, the second gate electrodes 508 are formed so that each of the second gate electrodes 508 overlaps with an associated one of the first gate electrodes 504. However, instead of this structure, such an overlapping portion does not have to be provided and the overlapping portion may be removed in a subsequent step.

Figure 11:
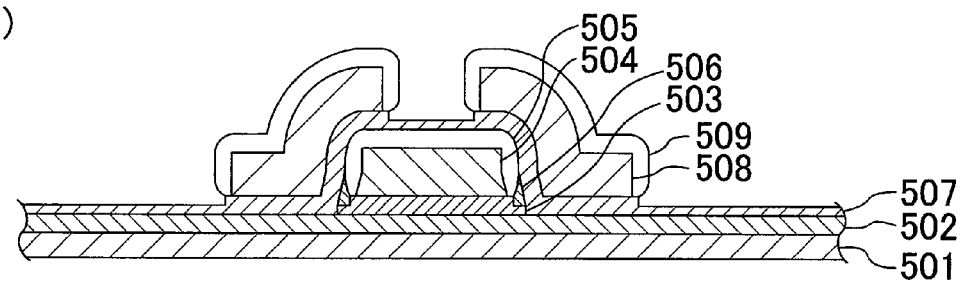
FIGS. 11(a) through 11(e) are cross-sectional views illustrating respective steps of a method for fabricating a solid state imaging device according to the fifth embodiment of the present invention.
Figure 11:
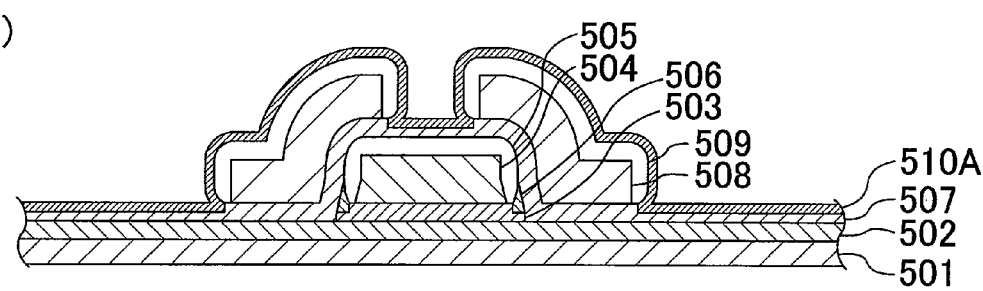
Figure 11:
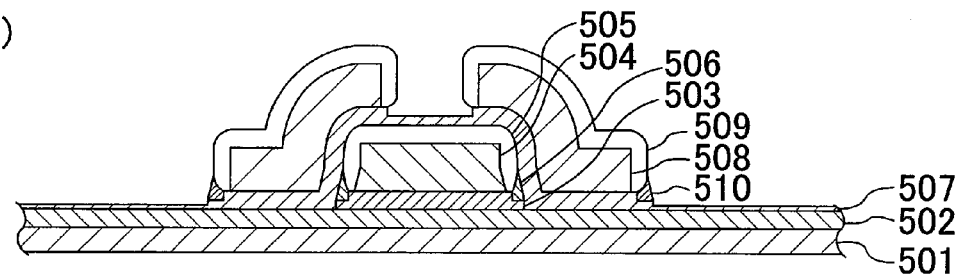
Figure 11:
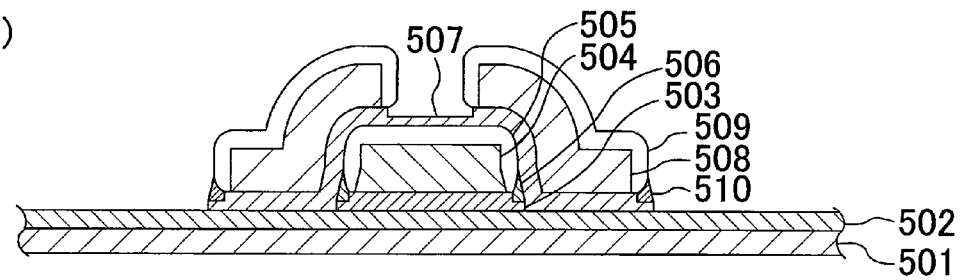
Figure 11:
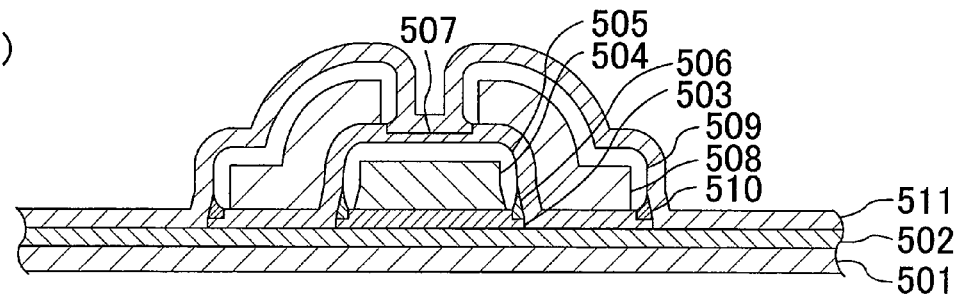

Next, as shown in FIG. 11(a), polysilicon forming each of the second gate electrodes 508 is thermally oxidized, thereby forming a fourth oxide film (silicon oxide film) 509 on upper part and side walls of each of the second gate electrodes 508. Because of a difference between an oxide film growth rate on the second nitride film 507 and an oxide film growth rate on the polysilicon film forming each of the second gate electrodes 508, a surface of the second nitride film 507 is hardly oxidized. As a result, the fourth oxide film 509 has a smaller thickness on lower part of each side wall of each of the second gate electrodes 508 than a thickness thereof on other part and an overhang shape is generated.

Next, as shown in FIG. 11(b), a fifth oxide film (silicon oxide film) 510A is formed over the semiconductor substrate 501, for example, by low pressure CVD so as to have a thickness of about 5-50 nm.

Next, as shown in FIG. 11(c), a surface of the fifth oxide film 510A is entirely etched, for example, by anisotropic dry etching. Thus, a second sidewall spacer 510 formed of the fifth oxide film 510A is buried in an overhang portion generated due to the fourth oxide film 509 covering each side wall of each of the second gate electrodes 508, so that the overhang shape is modified. At this point, in part of the second nitride film 507 other than part thereof located under each of the gate electrodes 504 and 508, a film thickness is reduced by a certain amount due to the etching.

Next, as shown in FIG. 11(d), part of the second nitride film 507 located between the second gate electrodes 508 is removed by wet etching using phosphoric acid which is highly selective with respect to an oxide film.

Next, as shown in FIG. 11(e), a third nitride film (silicon nitride film) 511 is formed over the semiconductor substrate 501, for example, by low pressure CVD so as to have the same thickness (for example, 20-100 nm) as a thickness of the part of the first nitride film 503 located under each of the first gate electrodes 504. Thus, the fourth oxide film 509, the second sidewall spacer 510 and the part of the first oxide film 502 located between the second gate electrodes 508 are covered by the third nitride film 511.

Figure 12:
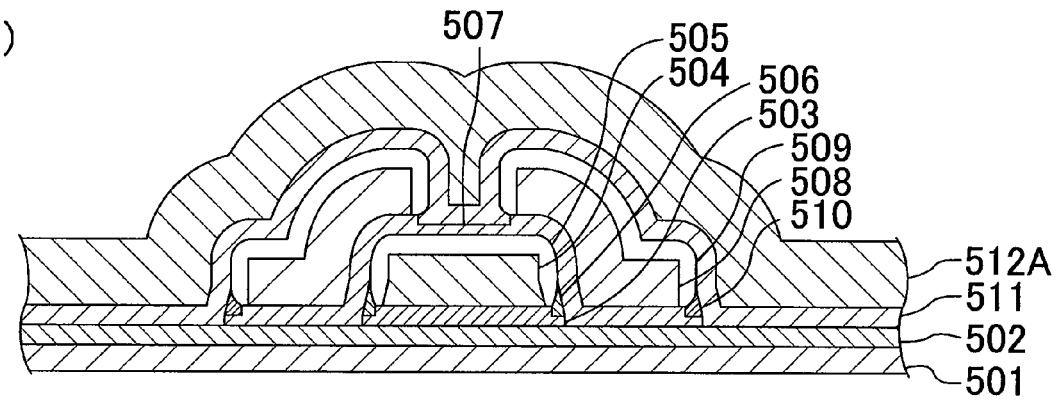
FIGS. 12(a) and 12(b) are cross-sectional views illustrating respective steps of a method for fabricating a solid state imaging device according to the fifth embodiment of the present invention.
Figure 12:
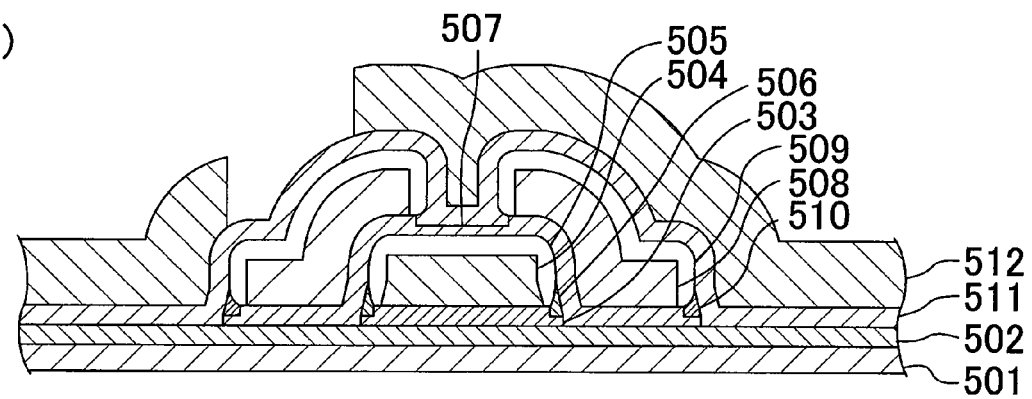

Next, as shown in FIG. 12(a), to form third gate electrodes 512, for example, a conductive film, such as a polysilicon film 512A, is formed over the semiconductor substrate 501. Then, as shown in FIG. 12(b), the polysilicon film 512A is patterned using lithography and etching, thereby forming a plurality of third gate electrodes 512 on at least part of the third nitride film 511 located between adjacent two of the second gate electrodes 508. Each of the third gate electrodes 512 is separated from an associated one of the second gate electrodes 508 by the fourth oxide film 509, the second sidewall spacer 510 and the third nitride film 511 and separated from the semiconductor substrate 501 by the first oxide film 502 and the third nitride film 511.

In this embodiment, the third gate electrodes 512 are formed so that each of the third gate electrodes 512 overlaps with an associated one of the second gate electrodes 508. However, instead of this structure, such an overlapping portion does not have to be provided and the overlapping portion may be removed in a subsequent step.

Figure 13:
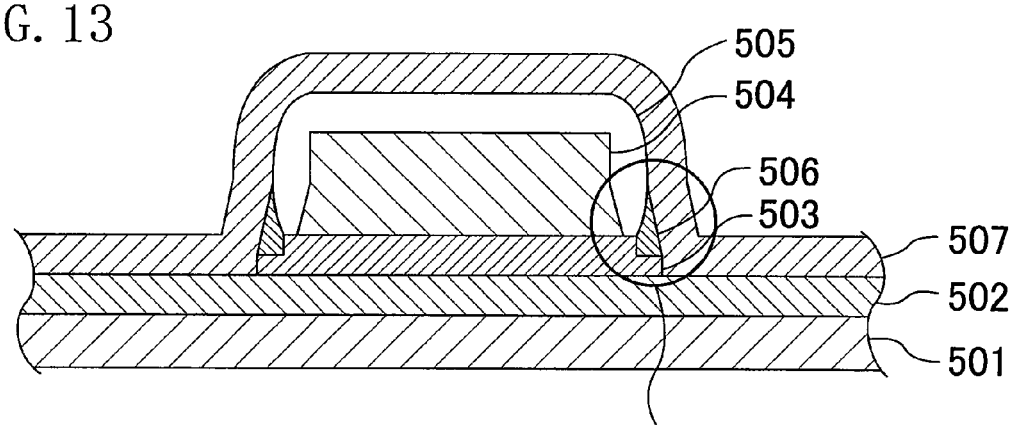
FIG. 13 is a cross-sectional view illustrating a region from which a polysilicon film to serve as a second gate electrode is to be completely removed in each transfer portion of the solid state imaging device of the fifth embodiment of the present invention.
Figure 14:
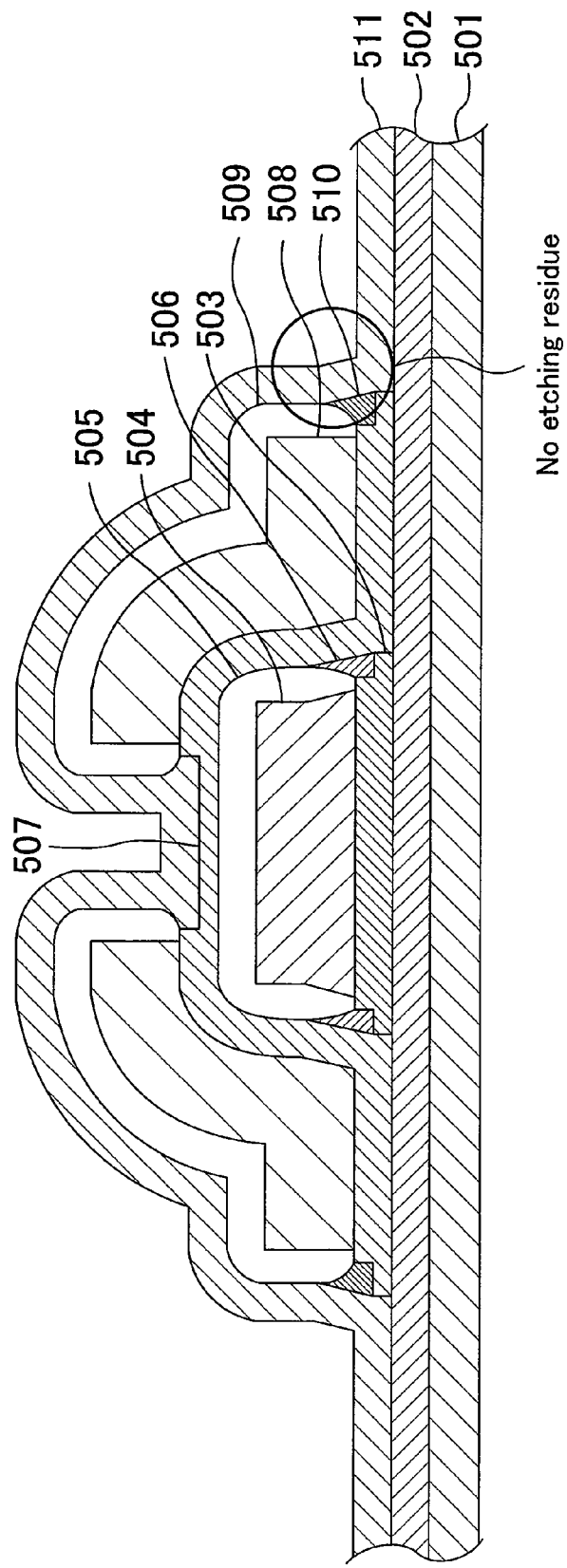
FIG. 14 is a cross-sectional view illustrating a region from which a polysilicon film to serve as a third gate electrode is to be completely removed in each transfer portion of the solid state imaging device of the fifth embodiment of the present invention.
Figure 15:
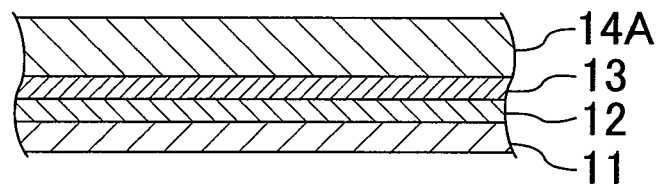
FIGS. 15(a) through 15(e) are cross-sectional views illustrating respective steps of a known method for fabricating a solid state imaging device.
Figure 15:
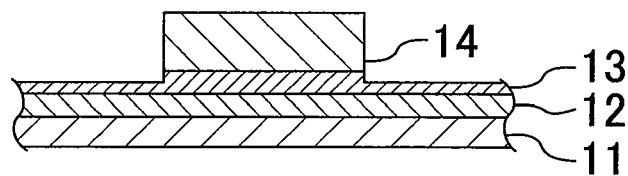
Figure 15:
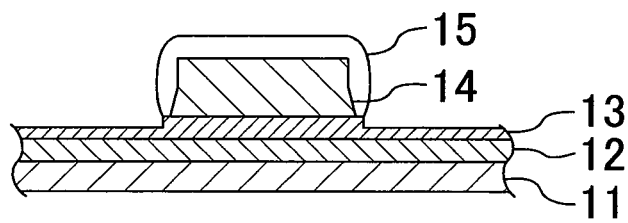
Figure 15:
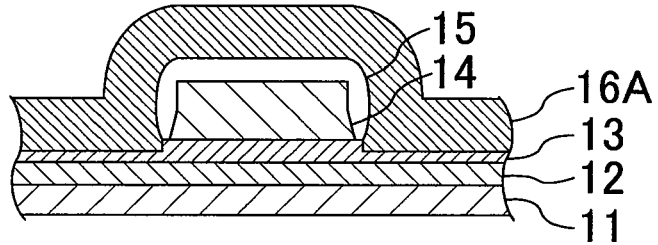
Figure 15:
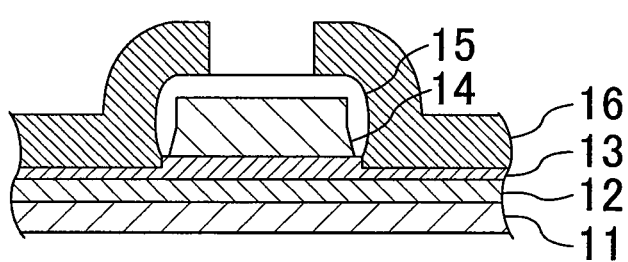
Figure 16:
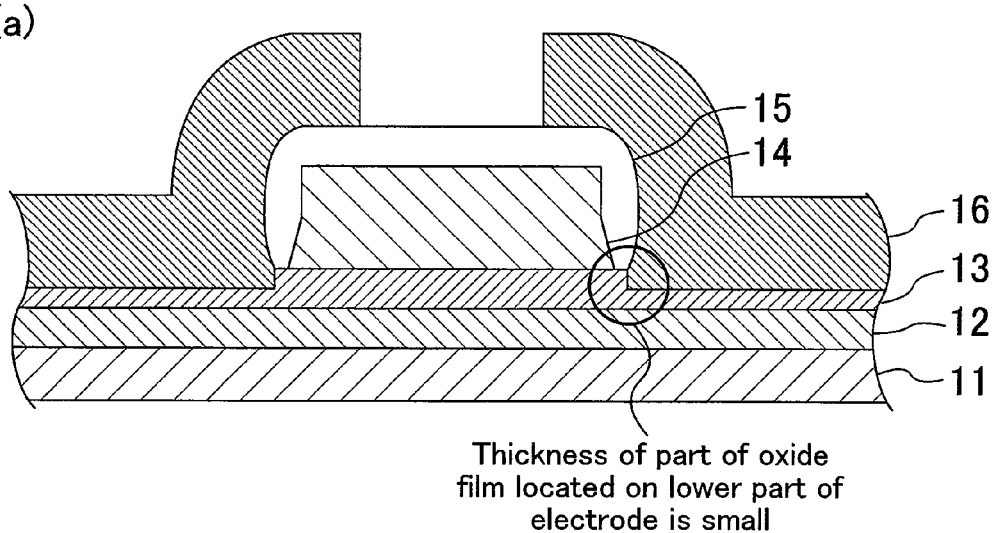
FIGS. 16(a) and 16(b) are cross-sectional views for explaining problems of the known solid state imaging device.
Figure 16:
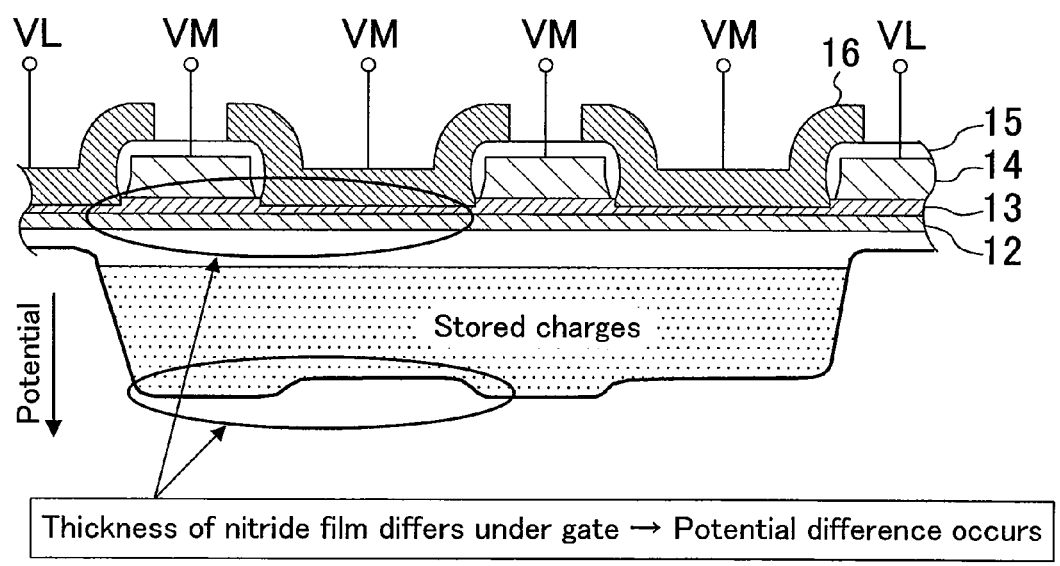
Figure 17:
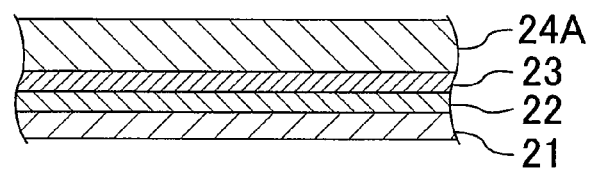
FIGS. 17(a) through 17(g) are cross-sectional views illustrating respective steps of another known method for fabricating a solid state imaging device.
Figure 17:
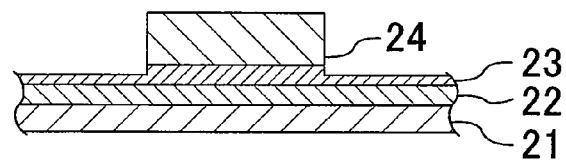
Figure 17:
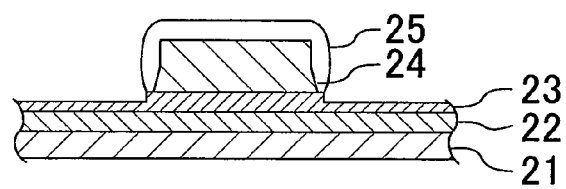
Figure 17:
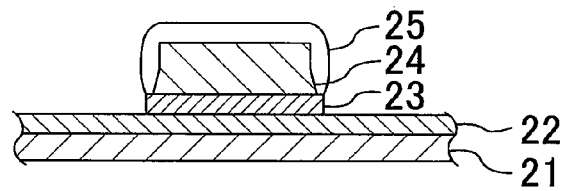
Figure 17:
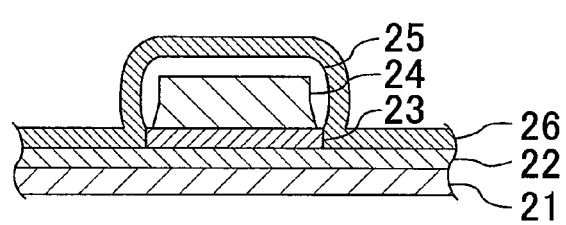
Figure 17:
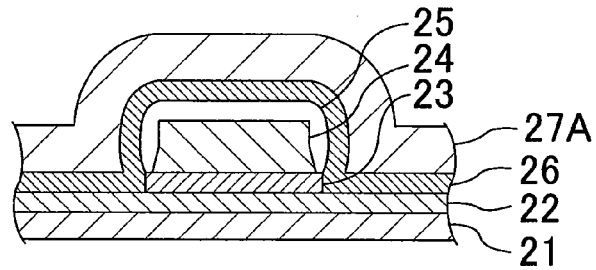
Figure 17:
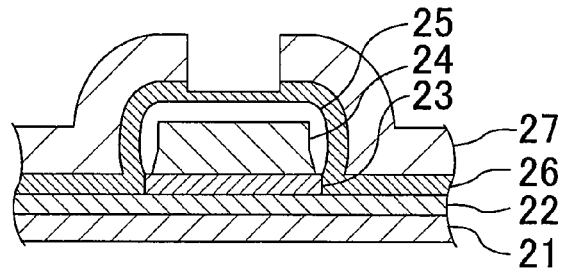
Figure 18:
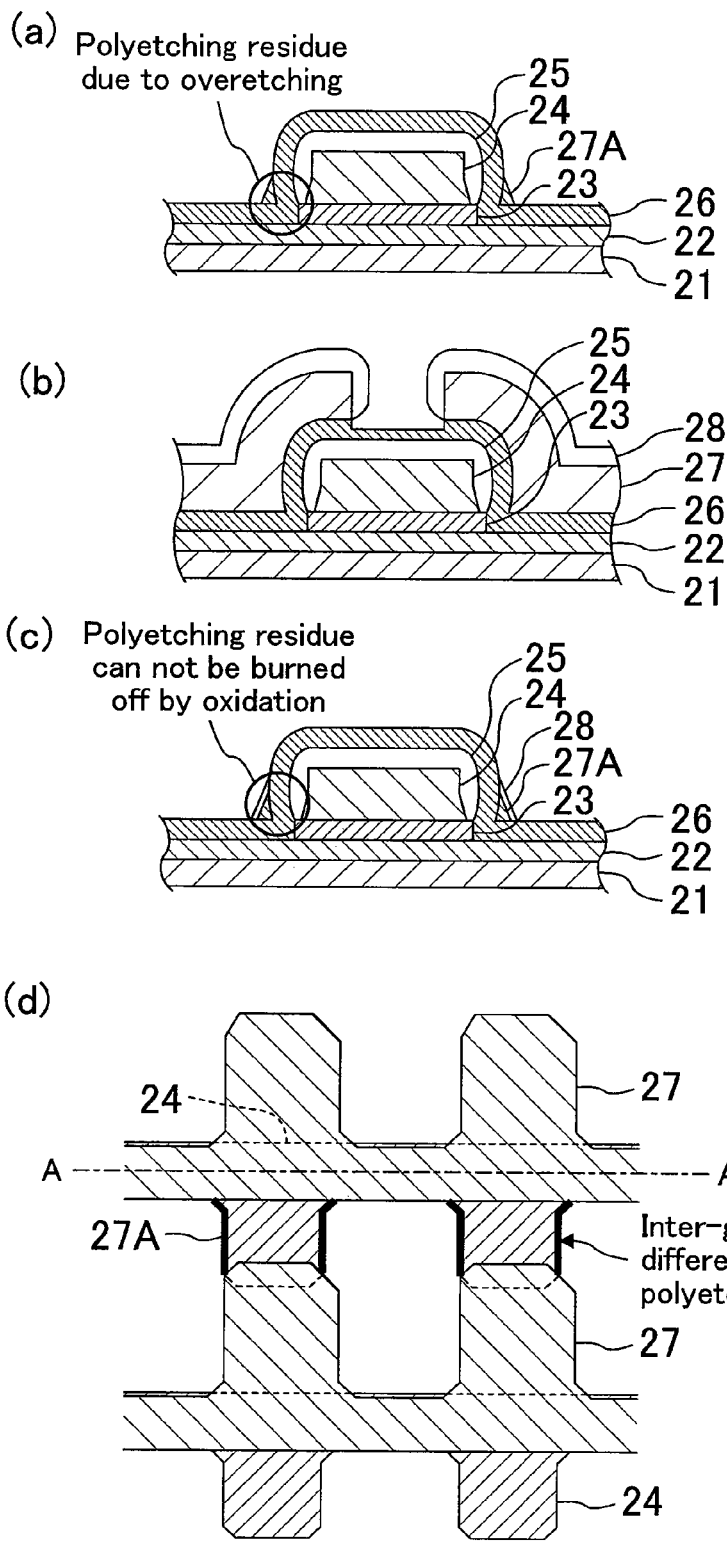
FIGS. 18(a) through 18(d) are cross-sectional views for explaining problems of another known solid state imaging device.

As has been described, according to this embodiment, the overhang shape generated due to a difference between the oxide film growth rate on, for example, the polysilicon film forming each of the first gate electrodes 504 and the oxide film growth rate on the first nitride film 503 can be modified by forming the sidewall spacer 506 of the third oxide film 506A so as to be buried in the overhang portion generated on each side wall of each of the first gate electrodes 504 covered by the second oxide film 505. Also, the overhang shape generated due to a difference between the oxide film growth rate on, for example, the polysilicon film forming each of the second gate electrodes 508 and the oxide film growth rate on the second nitride film 507 can be modified by forming the second sidewall spacer 510 of the fifth oxide film 510A so as to be buried in the overhang portion generated on each side wall of each of the second gate electrodes 508 covered by the fourth oxide film 509. Thus, the generation of an etching residue in etching, for example, the polysilicon films which are to be the second gate electrodes 508 and the third gate electrodes 512, respectively, can be prevented, so that electrical connection between gate electrodes having different phases can be avoided. Therefore, a high-breakdown voltage solid state imaging device can be obtained. FIG. 13 is a cross-sectional view illustrating a region from which a polysilicon film to form the second gate electrodes 508 is to be completely removed in each transfer portion of the solid state imaging device of this embodiment. As shown in FIG. 13, the generation of a polysilicon etching residue is not observed in the region. Moreover, FIG. 14 is a cross-sectional view illustrating a region from which a polysilicon film to form the third gate electrodes 512 is to be completely removed in each transfer portion of the solid state imaging device of this embodiment. As shown in FIG. 14, the generation of a polysilicon etching residue is not observed in the region.

According to this embodiment, a thickness of part of a nitride film located under each of the first gate electrodes 504, a thickness of part of a nitride film located under each of the second gate electrodes 508 and a thickness of part of a nitride film located under each of the third gate electrodes 512 can be set to be the same. Thus, the generation of a difference between potentials under the gate electrodes can be prevented, so that excellent saturated charge amount and transfer efficiency can be maintained.

According to this embodiment, each of the first gate electrodes 504 and an associated one of the second gate electrodes 508 are electrically separated from each other by the second oxide film 505, the first sidewall spacer 506 formed of the third oxide film 506A and the second nitride film 507 and each of the second gate electrodes 508 and an associated one of the third gate electrodes 512 are electrically separated from each other by the fourth oxide film 509, the second sidewall spacer 510 formed of the fifth oxide film 510A and the third nitride film 511. Thus, an inter-gate breakdown voltage is improved, so that a leakage current is much less likely to be generated. Since a dielectric constant of a nitride film is about the double of a dielectric constant of an oxide film, an effective thickness of an interlevel film can be reduced. Therefore, excellent transfer efficiency can be ensured.

In this embodiment, as a gate insulating film located under each of the gate electrodes 504, 508 and 512, a two-layer structure (ON structure) including a thermally-oxidized film and a silicon nitride film is used. However, instead of the two-layer structure, a three-layer structure (ONO structure) in which a thermally-oxidized film or a low-pressure CVD oxide film is further formed on the silicon nitride film may be used. Specifically, after formation of the first nitride film 503 and before formation of the first gate electrodes 504, an oxide film may be formed on the first nitride film 503, after formation of the second nitride film 507 and before formation of the second gate electrodes 508, an oxide film may be formed on the second nitride film 507, and after formation of the third nitride film 511 and before formation of the third gate electrodes 512, an oxide film may be formed on the third nitride film 511.

In this embodiment, as in the first embodiment, after formation of the first sidewall spacer of an oxide film, part of the first nitride film located between the first gate electrodes is removed and the second nitride film having the same thickness as a thickness of part of the first nitride film located under each of the first gate electrodes is newly formed. However, instead of this structure, as in the second embodiment, even if after formation of the first sidewall spacer of an oxide film, the part of the first nitride film located between the first gate electrodes is not removed and the second nitride film having a thickness corresponding to an amount of reduction in film thickness of the first nitride film due to etching and the like is additionally formed, the same effects as those of this embodiment can be achieved. Alternatively, as in the third embodiment, after removal of the part of the first nitride film located between the first gate electrodes, the second nitride film having the same thickness as a thickness of the part of the first nitride film located under each of the first gate electrodes may be newly formed and then the first sidewall spacer of an oxide film may be formed. As another alternative, as in the fourth embodiment, without removal of the part of the first nitride film located between the first gate electrodes, the second nitride film having a thickness corresponding to an amount of reduction in film thickness of the first nitride film due to etching and the like may be additionally formed and then the first sidewall spacer of an oxide film may be formed.

Moreover, in this embodiment, for formation of a second sidewall spacer, the same process step as the process step of forming a first sidewall spacer according to the first embodiment is used. However, instead of the process step of forming a first sidewall spacer according to the first embodiment, the process step of forming a first sidewall spacer according to any one of the second through fourth embodiments may be used. Different process steps may be used for forming the first and second sidewall spacers of this embodiment, respectively.

Moreover, this embodiment is directed to a solid state imaging device including transfer portions each having a three-layer gate structure. However, this embodiment may be directed to a solid state imaging device including transfer portions having, instead of a three-layer gate structure, a four- or more-layer gate structure.

INDUSTRIAL APPLICABILITY

According to the present invention, a high-performance, high-breakdown voltage solid state imaging device can be realized. Thus, a solid state imaging device according to the present invention and a method for fabricating the solid state imaging device can be preferably used, specifically, for a solid state imaging device used in a camera-equipped cellular phone, a video camera, a digital still camera or the like or a line sensor used in a printer.

The invention claimed is:

1. A method for fabricating a solid state imaging device, the method comprising:
   a first step of forming a first oxide film and a first nitride film over a semiconductor substrate so that the first oxide film and the first nitride film are stacked in this order;
   a second step of forming, on the first nitride film, a plurality of first gate electrodes so that the first gate electrodes are arranged so as to be spaced apart from one another with a predetermined distance therebetween;
   a third step of forming a second oxide film so that the second oxide film covers upper part and side walls of each said first gate electrode;
   a fourth step of forming a sidewall spacer of a third oxide film so that the sidewall spacer is buried in an overhang portion generated on each side wall of each said first gate electrode covered by the second oxide film;
   a fifth step of forming a second nitride film so that the second nitride film covers the second oxide film, the sidewall spacer and part of the first nitride film located between the first gate electrodes;
   a sixth step of forming a plurality of second gate electrodes on at least part of the second nitride film located between adjacent two of the first gate electrodes;
   a seventh step of forming a fourth oxide film on the first nitride film after the first step and before the second step; and
   an eighth step of forming a fifth oxide film on the second nitride film after the fifth step and before the sixth step, wherein:
   in the second step, part of the first nitride film is remained between the first gate electrodes, and
   a thickness of the second nitride film is adjusted so that a total of respective thicknesses of parts of the first nitride film and the second nitride film located under a bottom of each said second gate electrode is the same as a thickness of part of the first nitride film located under a bottom of each said first gate electrode.

2. The method of claim 1, wherein a thickness of the second nitride film is 2 nm or more and 35 nm or less.

3. The method of claim 1, wherein the first oxide film has a thickness of 10-50 nm.

4. The method of claim 1, wherein the first nitride film located under the bottom of each said first gate electrode has a thickness of 20-100 nm.

5. The method of claim 2, wherein the first oxide film has a thickness of 10-50 nm.

6. The method of claim 2, wherein the first nitride film located under the bottom of each said first gate electrode has a thickness of 20-100 nm.

* * * * *